US012723054B2

(12) United States Patent
Seifermann

(10) Patent No.: US 12,723,054 B2
(45) Date of Patent: Sep. 1, 2026

(54) ORGANIC MOLECULES FOR OPTOELECTRONIC DEVICES

(71) Applicant: Samsung Display Co., Ltd., Yongin-si (KR)

(72) Inventor: Stefan Seifermann, Bühl (DE)

(73) Assignee: Samsung Display Co., Ltd., Yongin-si (KR)

( * ) Notice: Subject to any disclaimer, the term of this patent is extended or adjusted under 35 U.S.C. 154(b) by 986 days.

(21) Appl. No.: 17/759,696

(22) PCT Filed: Jan. 25, 2021

(86) PCT No.: PCT/EP2021/051588
§ 371 (c)(1),
(2) Date: Jul. 28, 2022

(87) PCT Pub. No.: WO2021/151822
PCT Pub. Date: Aug. 5, 2021

(65) Prior Publication Data

US 2023/0099889 A1 Mar. 30, 2023

(30) Foreign Application Priority Data

Jan. 28, 2020 (EP) .................................... 20154136

(51) Int. Cl.
*C07F 5/02* (2006.01)
*C09K 11/06* (2006.01)
(Continued)

(52) U.S. Cl.
CPC .............. *C07F 5/027* (2013.01); *C09K 11/06* (2013.01); *H10K 85/658* (2023.02); (Continued)

(58) Field of Classification Search
CPC ................. C07F 5/027; H10K 85/658; C09K 2211/1022
See application file for complete search history.

(56) References Cited

U.S. PATENT DOCUMENTS

| | | | |
|---|---|---|---|
| 10,686,141 | B2 | 6/2020 | Hatakeyama et al. |
| 10,689,402 | B2 | 6/2020 | Hatakeyama et al. |

(Continued)

FOREIGN PATENT DOCUMENTS

| | | | |
|---|---|---|---|
| CN | 110662750 | A | 1/2020 |
| JP | 2018-043984 | A | 3/2018 |

(Continued)

OTHER PUBLICATIONS

WO-2018216990-A1—translation (Year: 2018).*

(Continued)

*Primary Examiner* — Rachel Simbana
(74) *Attorney, Agent, or Firm* — Womble Bond Dickinson (US) LLP

(57) ABSTRACT

An organic molecule that may be used application in optoelectronic devices is disclosed. The organic molecule has a structure of formula 1, wherein $R^I$, $R^{II}$, $R^{III}$, $R^{IV}$, $R^V$, $R^{VI}$, $R^{VII}$, $R^A$, $R^B$, $R^C$, $R^D$, $R^E$, $R^F$, $R^G$ and $R^H$ are independently selected from the group consisting of: hydrogen, deuterium, halogen, $C_1$-$C_{12}$-alkyl, wherein optionally one or more hydrogen atoms are independently substituted by $R^5$; $C_6$-$C_{18}$-aryl, wherein optionally one or more hydrogen atoms are independently substituted $R^5$; and $C_3$-$C_{15}$-heteroaryl, wherein optionally one or more hydrogen atoms are independently substituted $R^5$; optionally, any adjacent two of $R^I$, $R^{II}$, $R^{III}$, $R^{IV}$, $R^V$, $R^{VI}$, $R^{VII}$, $R^A$, $R^B$, $R^C$, $R^D$, $R^E$, $R^F$, $R^G$ and $R^H$ form a monocyclic ring system having 5 to 8 C-atoms, at least $R^A$ and $R^B$ as well as $R^C$ and $R^D$ form a (Continued)

monocyclic ring system having 5 to 8 C-atoms, wherein, optionally, each hydrogen is independently substituted.

Formula I

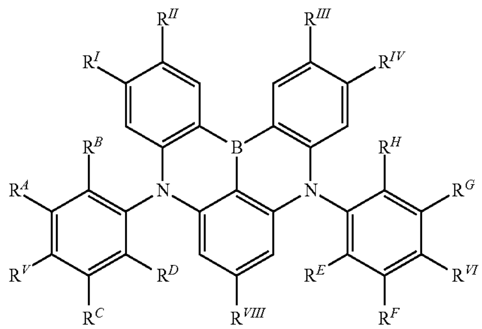

9 Claims, 1 Drawing Sheet

(51) Int. Cl.
*H10K 50/11* (2023.01)
*H10K 71/16* (2023.01)
*H10K 85/60* (2023.01)
*H10K 101/20* (2023.01)

(52) U.S. Cl.
CPC ....... *C09K 2211/1011* (2013.01); *H10K 50/11* (2023.02); *H10K 2101/20* (2023.02)

(56) References Cited

U.S. PATENT DOCUMENTS

| | | | |
|---|---|---|---|
| 12,156,468 | B2 | 11/2024 | Jeong et al. |
| 2020/0176679 | A1 | 6/2020 | Jeong et al. |

FOREIGN PATENT DOCUMENTS

| | | | | |
|---|---|---|---|---|
| JP | 2019-195060 A | 11/2019 | | |
| KR | 10-2018-0127918 A | 11/2018 | | |
| WO | WO 2016/152418 A1 | 9/2016 | | |
| WO | WO-2018216990 A1 * | 11/2018 | ............. | C09K 11/06 |
| WO | WO-2020017931 A1 * | 1/2020 | ................ | C07F 5/02 |

OTHER PUBLICATIONS

WO-2020017931-A1—translation (Year: 2020).*
International Search Report for corresponding Application No. PCT/EP2021/051588 dated Apr. 19, 2021, 2pp.

* cited by examiner

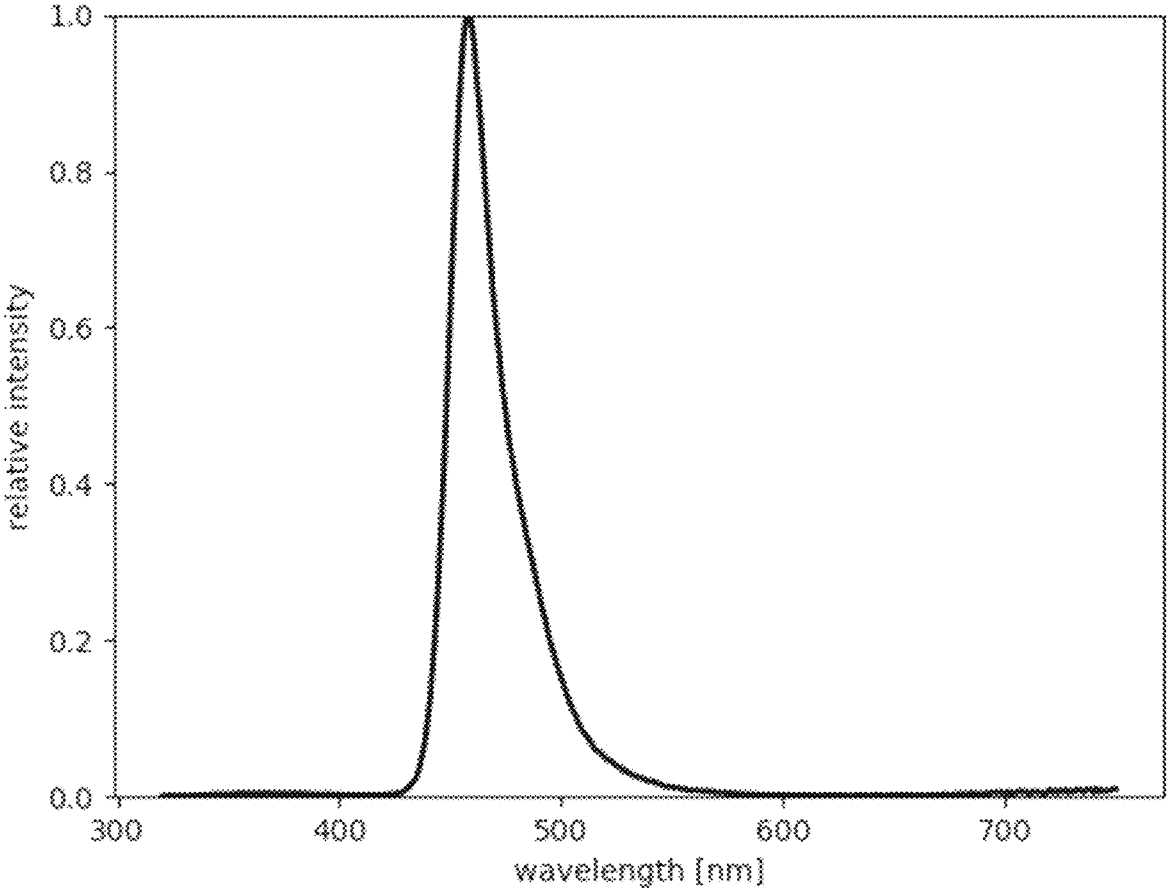
1.0
0.8
0.6
0.4
0.2
0.0
relative intensity
300
400
500
600
700
wavelength [nm]

ORGANIC MOLECULES FOR OPTOELECTRONIC DEVICES

CROSS-REFERENCE TO RELATED APPLICATIONS

This application is a U.S. National Phase Patent Application of International Patent Application Number PCT/EP2021/051588, filed on Jan. 25, 2021, which claims priority to European Patent Application Number 20154136.4, filed on Jan. 28, 2020, the entire content of all of which is incorporated herein by reference.

BACKGROUND

Field

Embodiments of the present disclosure relate to organic light-emitting molecules and their use in organic light-emitting diodes (OLEDs) and in other optoelectronic devices.

SUMMARY

The object of embodiments of the present disclosure is to provide molecules which are suitable for use in optoelectronic devices.

This object is achieved by embodiments of the present disclosure which provide a new class of organic molecules.

According to embodiments of the present disclosure the organic molecules may be purely organic molecules, e.g., they do not contain any metal ions in contrast to metal complexes known for the use in optoelectronic devices. The organic molecules of embodiments of the present disclosure, however, may include metalloids such as, for example, B, Si, Sn, Se, and/or Ge.

According to embodiments of the present disclosure, the organic molecules exhibit emission maxima in the blue, sky-blue or green spectral range. The organic molecules exhibit, for example, emission maxima between 420 nm and 520 nm, for example, between 440 nm and 495 nm, or between 450 nm and 470 nm. The photoluminescence quantum yields of the organic molecules according to embodiments of the present disclosure are, for example, 50% or more. The use of the molecules according to embodiments of the present disclosure in an optoelectronic device, for example an organic light-emitting diode (OLED), leads to higher efficiencies and/or higher color purity, expressed by the full width at half maximum (FWHM) of emission, of the device. Corresponding OLEDs have a higher stability than OLEDs including other emitter materials and comparable color.

The organic light-emitting molecules according to embodiments of the present disclosure may be represented by Formula I, Formula I

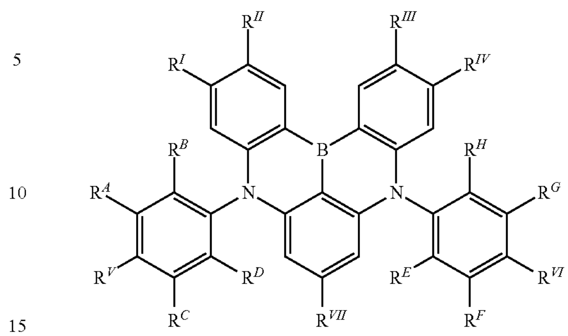

wherein $R^I$, $R^{II}$, $R^{III}$, $R^{IV}$, $R^V$, $R^{VI}$, $R^{VII}$, $R^A$, $R^B$, $R^C$, $R^D$, $R^E$, $R^F$, $R^G$ and $R^H$ are independently selected from the group consisting of:

hydrogen, deuterium, halogen, $C_1$-$C_{12}$-alkyl, wherein optionally one or more hydrogen atoms are independently substituted by $R^5$;

$C_6$-$C_{18}$-aryl, wherein optionally one or more hydrogen atoms are independently substituted $R^5$; and $C_3$-$C_{15}$-heteroaryl, wherein optionally one or more hydrogen atoms are independently substituted $R^5$.

$R^5$ is at each occurrence independently selected from the group consisting of:

hydrogen, deuterium, halogen, $C_1$-$C_{12}$-alkyl, wherein optionally one or more hydrogen atoms are independently substituted by $R^6$;

$C_6$-$C_{18}$-aryl, wherein optionally one or more hydrogen atoms are independently substituted $R^6$; and $C_3$-$C_{15}$-heteroaryl, wherein optionally one or more hydrogen atoms are independently substituted $R^6$.

$R^6$ is at each occurrence independently selected from the group consisting of:

hydrogen, deuterium, halogen, $C_1$-$C_{12}$-alkyl, $C_6$-$C_{18}$-aryl, wherein optionally one or more hydrogen atoms are independently substituted by $C_1$-$C_5$-alkyl substituents; and $C_3$-$C_{15}$-heteroaryl, wherein optionally one or more hydrogen atoms are independently substituted by $C_1$-$C_5$-alkyl substituents.

Any adjacent two of $R^I$, $R^{II}$, $R^{III}$, $R^{IV}$, $R^V$, $R^{VI}$, $R^{VII}$, $R^A$, $R^B$, $R^C$, $R^D$, $R^E$, $R^F$, $R^G$ and $R^H$ of the organic may form a monocyclic ring system having 5, 6, 7 or 8 C-atoms.

At least $R^A$ and $R^B$ as well as $R^C$ and $R^D$ of the organic molecule form a monocyclic ring system having 5, 6, 7 or 8 C-atoms, wherein, optionally, each hydrogen can independently from each other be substituted by $R^6$.

Optionally, each hydrogen of the organic molecule is independently substituted by deuterium or halogen.

In some embodiments of the organic molecule, each of $R^I$, $R^{II}$, $R^{III}$, $R^{IV}$, $R^V$, $R^{III}$ and $R^{VII}$ are independently selected from the group consisting of hydrogen, deuterium, halogen, $C_1$-$C_{12}$-alkyl, $C_6$-$C_{18}$-aryl, wherein optionally one or more hydrogen atoms are independently substituted by $C_1$-$C_5$-alkyl substituents; and $C_3$-$C_{15}$-heteroaryl, wherein optionally one or more hydrogen atoms are independently substituted by $C_1$-$C_5$-alkyl substituents, wherein, optionally, any adjacent two of $R^I$, $R^{II}$, $R^{III}$ and $R^{IV}$ together (e.g., $R^I$ and $R^{II}$ and/or $R^{III}$ and $R^{IV}$) form a monocyclic ring system having 5-8 C-atoms (e.g., 5, 6, 7 or 8 carbon atoms), wherein, optionally, each hydrogen can independently from each other be substituted by methyl (Me).

The term "monocyclic ring system" in particular refers to a non-aromatic ring system.

In some embodiments of the organic molecule, each of $R^I$, $R^{II}$, $R^{III}$, $R^{IV}$, $R^V$, $R^{VI}$ and $R^{VII}$ are independently selected from the group consisting of hydrogen, deuterium, halogen, Me, $^t$Bu, Ph (phenyl), cyclohexyl, and carbazole, wherein, optionally, any adjacent two of $R^I$, $R^{II}$, $R^{III}$ and $R^{IV}$ together form a monocyclic ring system having 5-8 C-atoms, wherein, optionally, each hydrogen can independently from each other be substituted by Me.

In some embodiments of the organic molecule, each of $R^I$, $R^{II}$, $R^{III}$, $R^{IV}$, $R^V$, $R^{VI}$ and $R^{VII}$ are independently selected from the group consisting of hydrogen, deuterium, halogen, Me, $^t$Bu, Ph, cyclohexyl, and carbazole.

In some embodiments of the organic molecule, either $R^I$ and $R^{IV}$, or $R^{II}$ and $R^{III}$ are cyclohexyl.

In some embodiments of the organic molecule, either $R^I$ and $R^{IV}$, or $R^{II}$ and $R^{III}$ are Ph.

In some embodiments of the organic molecule, either $R^I$ and $R^{IV}$, or $R^{II}$ and $R^{III}$ are Me.

In some embodiments of the organic molecule, $R^I$, $R^{II}$, $R^{III}$ and $R^{IV}$ are hydrogen.

In an example embodiment of the organic molecule, $R^{VII}$ is Me.

In an example embodiment of the organic molecule, $R^{VII}$ is hydrogen.

In one embodiment, the organic molecule is represented by Formula Ia, which is an example for $R^A$ and $R^B$ as well as $R^C$ and $R^D$ forming a monocyclic ring system having 5 C-atoms:

Formula Ia

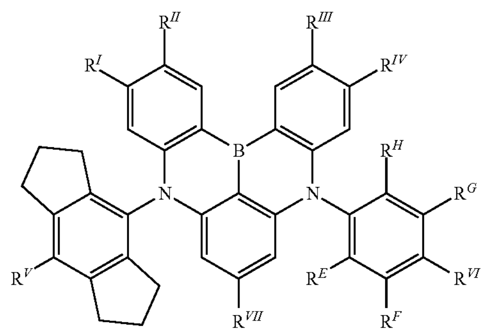

wherein each of $R^I$, $R^{II}$, $R^{III}$, $R^{IV}$, $R^V$, $R^{VI}$, $R^{VII}$, $R^E$, $R^F$, $R^G$ and $R^H$ are independently selected from the group consisting of hydrogen, deuterium, halogen, $C_1$-$C_1$-alkyl, $C_6$-$C_{18}$-aryl, wherein optionally one or more hydrogen atoms are independently substituted by $C_1$-$C_5$-alkyl substituents; and $C_3$-$C_{15}$-heteroaryl, wherein optionally one or more hydrogen atoms are independently substituted by $C_1$-$C_5$-alkyl substituents;

wherein, optionally, any adjacent two of $R^I$, $R^{II}$, $R^{III}$, $R^{IV}$, $R^E$, $R^F$, $R^G$ and $R^H$ together form a monocyclic ring system having 5, 6, 7 or 8 C-atoms, wherein, optionally, each hydrogen can independently from each other be substituted by Me.

In some embodiments, the organic molecule is represented by Formula Ia, wherein each of $R^I$, $R^{II}$, $R^{III}$, $R^{IV}$, $R^V$, $R^{VI}$, $R^{VII}$, $R^E$, $R^F$, $R^G$ and $R^H$ are independently selected from the group consisting of hydrogen, deuterium, halogen, Me, $^t$Bu, Ph, cyclohexyl, and carbazole, wherein, optionally, any adjacent two of $R^I$, $R^{II}$, $R^{III}$, $R^{IV}$, $R^E$, $R^F$, $R^G$ and $R^H$ together form a monocyclic ring system having 5-8 C-atoms, wherein, optionally, each hydrogen can independently from each other be substituted by Me.

In some embodiments, the organic molecule is represented by Formula Ia, wherein each of $R^I$, $R^{II}$, $R^{III}$, $R^{IV}$, $R^V$, $R^{VI}$, $R^{VII}$, $R^E$, $R^F$, $R^G$ and $R^H$ are independently selected from the group consisting of hydrogen, deuterium, halogen, Me, $^t$Bu, Ph, cyclohexyl, and carbazole.

In some embodiments, the organic molecule is represented by Formula Ia, wherein either $R^I$ and $R^{IV}$, or $R^{II}$ and $R^{III}$ are cyclohexyl.

In some embodiments, the organic molecule is represented by Formula Ia, wherein either $R^I$ and $R^{IV}$, or $R^{II}$ and $R^{III}$ are Ph.

In some embodiments, the organic molecule is represented by Formula Ia, wherein either $R^I$ and $R^{IV}$, or $R^{II}$ and $R^{III}$ are Me.

In some embodiments, the organic molecule is represented by Formula Ia, wherein $R^I$, $R^{II}$, $R^{III}$ and $R^{IV}$ are hydrogen.

In some embodiments, the organic molecule is represented by Formula Ia, wherein $R^F$ and $R^G$ are $^t$Bu.

In an example embodiment, the organic molecule is represented by Formula Ia, wherein $R^{VII}$ is Me.

In an example embodiment, the organic molecule is represented by Formula Ia, wherein $R^{VII}$ is hydrogen.

In one embodiment, the organic molecule is represented by Formula Ia-2, which is an example for $R^A$ and $R^B$, $R^C$ and $R^D$, $R^E$ and $R^F$, as well as $R^G$ and $R^H$ forming a monocyclic ring system having 5 C-atoms:

Formula Ia-2

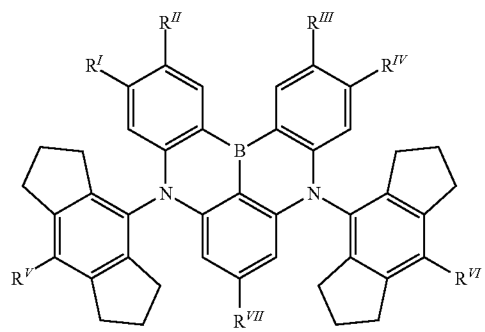

wherein each of $R^I$, $R^{II}$, $R^{III}$, $R^{IV}$, $R^V$, $R^{VI}$ and $R^{VII}$ are independently selected from the group consisting of hydrogen, deuterium, halogen, $C_1$-$C_{12}$-alkyl, $C_6$-$C_{18}$-aryl, wherein optionally one or more hydrogen atoms are independently substituted by $C_1$-$C_5$-alkyl substituents; and $C_3$-$C_{15}$-heteroaryl, wherein optionally one or more hydrogen atoms are independently substituted by $C_1$-$C_5$-alkyl substituents;

wherein, optionally, any adjacent two of $R^I$, $R^{II}$, $R^{III}$ and $R^{IV}$ together form a monocyclic ring system having 5, 6, 7 or 8 C-atoms, wherein, optionally, each hydrogen can independently from each other be substituted by Me.

In some embodiments, the organic molecule is represented by Formula Ia-2, wherein each of $R^I$, $R^{II}$, $R^{III}$, $R^{IV}$, $R^V$, $R^{VI}$ and $R^{VII}$ are independently selected from the group consisting of hydrogen, deuterium, halogen, Me, $^t$Bu, Ph, cyclohexyl, and carbazole, wherein, optionally, any adjacent two of $R^I$, $R^{II}$, $R^{III}$ and $R^{IV}$ together form a monocyclic ring system having 5-8 C-atoms, wherein, optionally, each hydrogen can independently from each other be substituted by Me.

In some embodiments, the organic molecule is represented by Formula Ia-2, wherein each of $R^I$, $R^{II}$, $R^{III}$, $R^{IV}$, $R^V$, $R^{VI}$ and $R^{VII}$ are independently selected from the group consisting of hydrogen, deuterium, halogen, Me, $^t$Bu, Ph, cyclohexyl, and carbazole.

In some embodiments, the organic molecule is represented by Formula Ia-2, wherein either $R^I$ and $R^{IV}$, or $R^{II}$ and $R^{III}$ are cyclohexyl.

In some embodiments, the organic molecule is represented by Formula Ia-2, wherein either $R^I$ and $R^{IV}$, or $R^{II}$ and $R^{III}$ are Ph.

In some embodiments, the organic molecule is represented by Formula Ia-2, wherein either $R^I$ and $R^{IV}$, or $R^{II}$ and $R^{III}$ are Me.

In some embodiments, the organic molecule is represented by Formula Ia-2, wherein $R^I$, $R^{II}$, $R^{III}$ and $R^{IV}$ are hydrogen.

In an example embodiment, the organic molecule is represented by Formula Ia-2, wherein $R^{VII}$ is Me.

In an example embodiment, the organic molecule is represented by Formula Ia-2, wherein $R^{VII}$ is hydrogen.

In one embodiment, the organic molecule is represented by Formula Ib, which is an example where $R^A$ and $R^B$ as well as $R^C$ and $R^D$ form a monocyclic ring system having 6 C-atoms:

Formula Ib

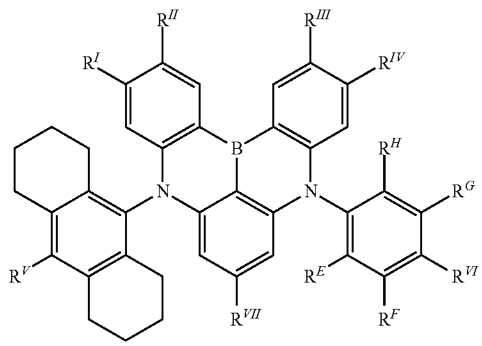

wherein each of $R^I$, $R^{II}$, $R^{III}$, $R^{IV}$, $R^V$, $R^{VI}$, $R^{VII}$, $R^E$, $R^F$, $R^G$ and $R^H$ are independently selected from the group consisting of hydrogen, deuterium, halogen, $C_1$-$C_{12}$-alkyl, $C_6$-$C_{18}$-aryl, wherein optionally one or more hydrogen atoms are independently substituted by $C_1$-$C_5$-alkyl substituents; and $C_3$-$C_{15}$-heteroaryl, wherein optionally one or more hydrogen atoms are independently substituted by $C_1$-$C_5$-alkyl substituents;

wherein, optionally, any adjacent two of $R^I$, $R^{II}$, $R^{III}$, $R^{IV}$, $R^E$, $R^F$, $R^G$ and $R^H$ together form a monocyclic ring system having 5, 6, 7 or 8 C-atoms, wherein, optionally, each hydrogen can independently from each other be substituted by Me.

In some embodiments, the organic molecule is represented by Formula Ib, wherein each of $R^I$, $R^{II}$, $R^{III}$, $R^{IV}$, $R^V$, $R^{VI}$, $R^{VII}$, $R^E$, $R^F$, $R^G$ and $R^H$ are independently selected from the group consisting of hydrogen, deuterium, halogen, Me, $^t$Bu, Ph, cyclohexyl, and carbazole, wherein, optionally, any adjacent two of $R^I$, $R^{II}$, $R^{III}$, $R^{IV}$, $R^E$, $R^F$, $R^G$ and $R^H$ together form a monocyclic ring system having 5-8 C-atoms, wherein, optionally, each hydrogen can independently from each other be substituted by Me.

In some embodiments, the organic molecule is represented by Formula Ib, wherein each of $R^I$, $R^{II}$, $R^{III}$, $R^{IV}$, $R^V$, $R^{VI}$, $R^{VII}$, $R^E$, $R^F$, $R^G$ and $R^H$ are independently selected from the group consisting of hydrogen, deuterium, halogen, Me, $^t$Bu, Ph, cyclohexyl, and carbazole.

In some embodiments, the organic molecule is represented by Formula Ib, wherein either $R^I$ and $R^{IV}$, or $R^{II}$ and $R^{III}$ are cyclohexyl.

In some embodiments, the organic molecule is represented by Formula Ib, wherein either $R^I$ and $R^{IV}$, or $R^{II}$ and $R^{III}$ are Ph.

In some embodiments, the organic molecule is represented by Formula Ib, wherein either $R^I$ and $R^{IV}$, or $R^{II}$ and $R^{III}$ are Me.

In some embodiments, the organic molecule is represented by Formula Ib, wherein $R^I$, $R^{II}$, $R^{III}$ and $R^{IV}$ are hydrogen.

In some embodiments, the organic molecule is represented by Formula Ib, wherein $R^F$ and $R^G$ are $^t$Bu.

In an example embodiment, the organic molecule is represented by Formula Ib, wherein $R^{VII}$ is Me.

In an example embodiment, the organic molecule is represented by Formula Ib, wherein $R^{VII}$ is hydrogen.

In one embodiment, the organic molecule is represented by Formula Ib-2, which is an example of $R^A$ and $R^B$, $R^C$ and $R^D$, $R^E$ and $R^F$, as well as $R^G$ and $R^H$ each forming a monocyclic ring system having 6 C-atoms:

Formula Ib-2

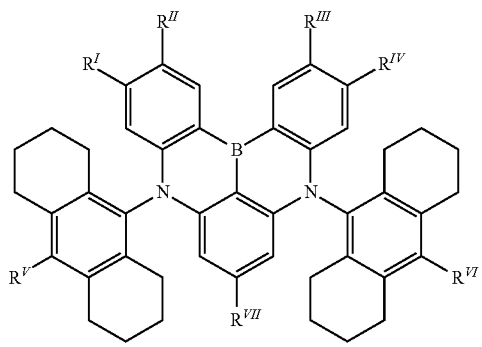

wherein each of $R^I$, $R^{II}$, $R^{III}$, $R^{IV}$, $R^V$, $R^{VI}$ and $R^{VII}$ are independently selected from the group consisting of hydrogen, deuterium, halogen, $C_1$-$C_{12}$-alkyl, $C_6$-$C_{18}$-aryl, wherein optionally one or more hydrogen atoms are independently substituted by $C_1$-$C_5$-alkyl substituents; and $C_3$-$C_{15}$-heteroaryl, wherein optionally one or more hydrogen atoms are independently substituted by $C_1$-$C_5$-alkyl substituents;

wherein, optionally, any adjacent two of $R^I$, $R^{II}$, $R^{III}$ and $R^{IV}$ together form a monocyclic ring system having 5, 6, 7 or 8 C-atoms, wherein, optionally, each hydrogen can independently from each other be substituted by Me.

In some embodiments, the organic molecule is represented by Formula Ib-2, wherein each of $R^I$, $R^{II}$, $R^{III}$, $R^{IV}$, $R^V$, $R^{VI}$ and $R^{VII}$ are independently selected from the group consisting of hydrogen, deuterium, halogen, Me, $^t$Bu, Ph, cyclohexyl, and carbazole, wherein, optionally, any adjacent two of $R^I$, $R^{II}$, $R^{III}$ and $R^{IV}$ together form a monocyclic ring system having 5-8 C-atoms, wherein, optionally, each hydrogen can independently from each other be substituted by Me.

In some embodiments, the organic molecule is represented by Formula Ib-2, wherein each of $R^I$, $R^{II}$, $R^{III}$, $R^{IV}$, $R^V$, $R^{VI}$ and $R^{VII}$ are independently selected from the group consisting of hydrogen, deuterium, halogen, Me, $^t$Bu, Ph, cyclohexyl, and carbazole.

In some embodiments, the organic molecule is represented by Formula Ib-2, wherein either $R^I$ and $R^{IV}$, or $R^{II}$ and $R^{III}$ are cyclohexyl.

In some embodiments, the organic molecule is represented by Formula Ib-2, wherein either $R^I$ and $R^{IV}$, or $R^{II}$ and $R^{III}$ are Ph.

In some embodiments, the organic molecule is represented by Formula Ib-2, wherein either $R^I$ and $R^{IV}$, or $R^{II}$ and $R^{III}$ are Me.

In some embodiments, the organic molecule is represented by Formula Ib-2, wherein $R^I$, $R^{II}$, $R^{III}$ and $R^{IV}$ are hydrogen.

In an example embodiment, the organic molecule is represented by Formula Ib-2, wherein $R^{VII}$ is Me.

In an example embodiment, the organic molecule is represented by Formula Ib-2, wherein $R^{VII}$ is hydrogen.

BRIEF DESCRIPTION OF THE DRAWING

The accompanying drawing, together with the specification, illustrate embodiments of the subject matter of the present disclosure, and, together with the description, serve to explain principles of embodiments of the subject matter of the present disclosure.

The accompanying FIGURE is a graph of an emission spectrum of an embodiment of the present disclosure according to Example 1.

DETAILED DESCRIPTION

As used throughout the present application, the terms "aryl" and "aromatic" may be understood in the broadest sense as any mono-, bi- or polycyclic aromatic moieties. Accordingly, an aryl group contains 6 to 60 aromatic ring atoms, and a heteroaryl group contains 5 to 60 aromatic ring atoms, of which at least one is a heteroatom. Notwithstanding, throughout the application the number of aromatic ring atoms may be given as subscripted number in the definition of certain substituents. For example, the heteroaromatic ring includes one to three heteroatoms. Again, the terms "heteroaryl" and "heteroaromatic" may be understood in the broadest sense as any mono-, bi- or polycyclic heteroaromatic moieties that include at least one heteroatom.

The heteroatoms may at each occurrence be the same or different and be individually selected from the group consisting of N, O and S. Accordingly, the term "arylene" refers to a divalent substituent that bears two binding sites to other molecular structures and thereby serving as a linker structure. In case a group in the example embodiments is defined differently from the definitions given here, for example, the number of aromatic ring atoms or number of heteroatoms differs from the given definition, the definition in the example embodiments is to be applied. According to embodiments of the present disclosure, a condensed (annulated) aromatic or heteroaromatic polycycle is built of two or more single aromatic or heteroaromatic cycles, which formed the polycycle via a condensation reaction.

As used throughout, the term "aryl group or heteroaryl group" includes groups which can be bound via any position of the aromatic or heteroaromatic group, derived from benzene, naphthalene, anthracene, phenanthrene, pyrene, dihydropyrene, chrysene, perylene, fluoranthene, benzanthracene, benzphenanthrene, tetracene, pentacene, benzpyrene, furan, benzofuran, isobenzofuran, dibenzofuran, thiophene, benzothiophene, isobenzothiophene, dibenzothiophene; pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridoimidazole, pyrazinoimidazole, quinoxalinoimidazole, oxazole, benzoxazole, naphthooxazole, anthroxazol, phenanthroxazol, isoxazole, 1,2-thiazole, 1,3-thiazole, benzothiazole, pyridazine, benzopyridazine, pyrimidine, benzopyrimidine, 1,3,5-triazine, quinoxaline, pyrazine, phenazine, naphthyridine, carboline, benzocarboline, phenanthroline, 1,2,3-triazole, 1,2,4-triazole, benzotrazole, 1,2,3-oxadiazole, 1,2,4-oxadiazole, 1,2,5-oxadiazole, 1,2,3,4-tetrazine, purine, pteridine, indolizine and benzothiadiazole or combinations of the abovementioned groups.

As used throughout, the term "cyclic group" may be understood in the broadest sense as any mono-, bi- or polycyclic moieties.

As used throughout, the term "biphenyl" as a substituent may be understood in the broadest sense as ortho-biphenyl, meta-biphenyl, or para-biphenyl, wherein ortho, meta and para is defined in regard to the binding site to another chemical moiety.

As used throughout, the term "alkyl group" may be understood in the broadest sense as any linear, branched, or cyclic alkyl substituent. For example, the term alkyl includes the substituents methyl (Me), ethyl (Et), n-propyl ($^n$Pr), i-propyl ($^i$Pr), cyclopropyl, n-butyl ($^n$Bu), i-butyl ($^i$Bu), s-butyl ($^s$Bu), t-butyl ($^t$Bu), cyclobutyl, 2-methylbutyl, n-pentyl, s-pentyl, t-pentyl, 2-pentyl, neo-pentyl, cyclopentyl, n-hexyl, s-hexyl, t-hexyl, 2-hexyl, 3-hexyl, neo-hexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2,2,2]octyl, 2-bicyclo[2,2,2]-octyl, 2-(2,6-dimethyl)octyl, 3-(3,7-dimethyl)octyl, adamantyl, 2,2,2-trifluorethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)-cyclohex-1-yl, 1-(n-butyl)-cyclohex-1-yl, 1-(n-hexyl)-cyclohex-1-yl, 1-(n-octyl)-cyclohex-1-yl and 1-(n-decyl)-cyclohex-1-yl.

As used throughout, the term "alkenyl" includes linear, branched, and cyclic alkenyl substituents. The term "alkenyl group", for example, includes the substituents ethenyl, propenyl, butenyl, pentenyl, cyclopentenyl, hexenyl, cyclohexenyl, heptenyl, cycloheptenyl, octenyl, cyclooctenyl or cyclooctadienyl.

As used throughout, the term "alkynyl" includes linear, branched, and cyclic alkynyl substituents. The term "alkynyl group", for example, includes ethynyl, propynyl, butynyl, pentynyl, hexynyl, heptynyl or octynyl.

As used throughout, the term "alkoxy" includes linear, branched, and cyclic alkoxy substituents. Examples of the term "alkoxy group" include methoxy, ethoxy, n-propoxy, i-propoxy, n-butoxy, i-butoxy, s-butoxy, t-butoxy and 2-methylbutoxy.

As used throughout, the term "thioalkoxy" includes linear, branched, and cyclic thioalkoxy substituents, in which the 0 of the example alkoxy groups is replaced by S.

As used throughout, the terms "halogen" and "halo" may be understood in the broadest sense as being, for example, fluorine, chlorine, bromine, or iodine.

Whenever hydrogen (H) is mentioned herein, it could also be replaced by deuterium at each occurrence.

It is understood that when a molecular fragment is described as being a substituent or otherwise attached to another moiety, its name may be written as if it were a fragment (e.g. naphthyl, dibenzofuryl) or as if it were the whole molecule (e.g. naphthalene, dibenzofuran). As used herein, these different ways of designating a substituent or attached fragment are considered to be equivalent.

In one embodiment, the organic molecules according to embodiments of the present disclosure have an excited state lifetime of not more than 150 μs, not more than 100 μs, for example, not more than 50 μs, not more than 10 μs, or not more than 7 μs in a film of poly(methyl methacrylate) (PMMA) with 5% by weight of the organic molecule at room temperature.

In one embodiment, the organic molecules according to embodiments of the present disclosure have an excited state lifetime of not more than 150 μs, of not more than 100 μs, for example, not more than 50 μs, not more than 10 μs, or not more than 7 μs in a film of poly(methyl methacrylate) (PMMA) with 1-5% by weight, for example, with 2% by weight of the organic molecule at room temperature.

In a further embodiment of the present disclosure, the organic molecules according to embodiments of the present disclosure have an emission peak in the visible or nearest ultraviolet range, e.g., in the range of a wavelength of from 380 nm to 800 nm, with a full width at half maximum of less than 0.23 eV, for example, less than 0.20 eV, less than 0.19 eV, less than 0.18 eV, or less than 0.17 eV in a film of poly(methyl methacrylate) (PMMA) with 5% by weight of the organic molecule at room temperature.

In a further embodiment of the present disclosure, the organic molecules according to embodiments of the present disclosure have an emission peak in the visible or nearest ultraviolet range, e.g., in the range of a wavelength of from 380 nm to 800 nm, with a full width at half maximum of less than 0.23 eV, for example, less than 0.20 eV, less than 0.19 eV, less than 0.18 eV, or less than 0.17 eV in a film of poly(methyl methacrylate) (PMMA) with 1-5% by weight, for example, with 2% by weight of the organic molecule at room temperature.

Orbital and excited state energies can be determined by means of experimental methods. The energy of the highest occupied molecular orbital $E^{HOMO}$ can be determined by methods known to the person skilled in the art from cyclic voltammetry measurements with an accuracy of 0.1 eV. The energy of the lowest unoccupied molecular orbital $E^{LUMO}$ is calculated as $E^{HOMO}+E^{gap}$, wherein $E^{gap}$ can be determined as follows: For host compounds, the onset of the emission spectrum of a film with 10% by weight of host in poly (methyl methacrylate) (PMMA) is used as $E^{gap}$, unless stated otherwise. For emitter molecules, $E^{gap}$ can be determined as the energy at which the excitation and emission spectra of a film with 10% by weight of emitter in PMMA cross. For the organic molecules according to embodiments of the present disclosure, $E^{gap}$ can be determined as the energy at which the excitation and emission spectra of a film with 5% by weight of emitter in PMMA cross.

The energy of the first excited triplet state T1 can be determined from the onset of the emission spectrum at low temperature, for example, at 77 K. For host compounds, where the first excited singlet state and the lowest triplet state are energetically separated by >0.4 eV, the phosphorescence is usually visible in a steady-state spectrum in 2-Me-THF. The triplet energy can thus be determined as the onset of the phosphorescence spectrum. For TADF emitter molecules, the energy of the first excited triplet state T1 can be determined from the onset of the delayed emission spectrum at 77 K, if not otherwise stated, measured in a film of PMMA with 10% by weight of emitter and in case of the organic molecules according to embodiments of the present disclosure with 1% by weight of the organic molecules according to embodiments of the present disclosure. Both for host and emitter compounds, the energy of the first excited singlet state S1 can be determined from the onset of the emission spectrum, if not otherwise stated, measured in a film of PMMA with 10% by weight of host or emitter compound and in case of the organic molecules according to embodiments of the present disclosure with 1% by weight of the organic molecules according to embodiments of the present disclosure.

The onset of an emission spectrum can be determined by computing the intersection of the tangent to the emission spectrum with the x-axis. The tangent to the emission spectrum is set at the high-energy side of the emission band and at the point at half maximum of the maximum intensity of the emission spectrum.

In one embodiment, the organic molecules according to embodiments of the present disclosure have an onset of the emission spectrum, which is energetically close to the emission maximum, e.g., the energy difference between the onset of the emission spectrum and the energy of the emission maximum is below 0.14 eV, for example, below 0.13 eV, or below 0.12 eV, while the full width at half maximum (FWHM) of the organic molecules is less than 0.23 eV, for example, less than 0.20 eV, less than 0.19 eV, less than 0.18 eV, or less than 0.17 eV in a film of poly(methyl methacrylate) (PMMA) with 5% by weight of the organic molecule at room temperature, resulting in a CIEy coordinate below 0.20, for example, below 0.18, below 0.16, or below 0.14.

In one embodiment, the organic molecules according to embodiments of the present disclosure have an onset of the emission spectrum, which is energetically close to the emission maximum, e.g., the energy difference between the onset of the emission spectrum and the energy of the emission maximum is below 0.14 eV, for example, below 0.13 eV, or below 0.12 eV, while the full width at half maximum (FWHM) of the organic molecules is less than 0.23 eV, for example, less than 0.20 eV, less than 0.19 eV, less than 0.18 eV, or less than 0.17 eV in a film of poly(methyl methacrylate) (PMMA) with 1-5% by weight, for example, with 2% by weight of the organic molecule at room temperature, resulting in a CIEy coordinate below 0.20, for example, below 0.18, below 0.16, or below 0.14.

A further aspect of embodiments of the present disclosure relates to the use of an organic molecule of embodiments of the present disclosure as a luminescent emitter or as an absorber, and/or as a host material and/or as an electron transport material, and/or as a hole injection material, and/or as a hole blocking material in an optoelectronic device.

An example embodiment relates to the use of an organic molecule according to embodiments of the present disclosure as a luminescent emitter in an optoelectronic device.

The optoelectronic device may be understood in the broadest sense as any suitable device based on organic materials that is suitable for emitting light in the visible or nearest ultraviolet (UV) range, e.g., in the range of a wavelength of from 380 to 800 nm. For example, the optoelectronic device may be able to emit light in the visible range, e.g., of from 400 nm to 800 nm.

In the context of such use, the optoelectronic device is, for example, selected from the group consisting of:

- organic light-emitting diodes (OLEDs),
- light-emitting electrochemical cells,
- OLED sensors, for example, in gas and vapor sensors that are not hermetically shielded to the surroundings,
- organic diodes,
- organic solar cells,
- organic transistors,
- organic field-effect transistors,
- organic lasers, and
- down-conversion elements.

In an example embodiment in the context of such use, the optoelectronic device is a device selected from the group consisting of an organic light emitting diode (OLED), a light emitting electrochemical cell (LEC), and a light-emitting transistor.

In the case of the use, the fraction of the organic molecule according to embodiments of the present disclosure in the emission layer in an optoelectronic device, for example, in an OLED, is 0.1% to 99% by weight, for example, 1% to 80% by weight. In some embodiments, the proportion of the organic molecule in the emission layer is 100% by weight.

In one embodiment, the light-emitting layer includes not only the organic molecules according to embodiments of the present disclosure, but also a host material whose triplet (T1) and singlet (S1) energy levels are energetically higher than the triplet (T1) and singlet (S1) energy levels of the organic molecule.

A further aspect of embodiments of the present disclosure relates to a composition including or consisting of:

(a) at least one organic molecule according to embodiments of the present disclosure, for example, in the form of an emitter and/or a host, and
(b) one or more emitter and/or host materials, which differ from the organic molecule according to embodiments of the present disclosure, and
(c) optionally one or more dyes and/or one or more solvents.

In one embodiment, the light-emitting layer includes (or essentially consists of) a composition including or consisting of:

(a) at least one organic molecule according to embodiments of the present disclosure, for example, in the form of an emitter and/or a host, and
(b) one or more emitter and/or host materials, which differ from the organic molecule according to embodiments of the present disclosure, and
(c) optionally one or more dyes and/or one or more solvents.

In some embodiments, the light-emitting layer EML includes (or essentially consists of) a composition including or consisting of:

(i) 0.1-10% by weight, for example, 0.5-5% by weight, or 1-3% by weight, of one or more organic molecules according to embodiments of the present disclosure;
(ii) 5-99% by weight, for example, 15-85% by weight, or 20-75% by weight, of at least one host compound H; and
(iii) 0.9-94.9% by weight, for example, 14.5-80% by weight, or 24-77% by weight, of at least one further host compound D with a structure differing from the structure of the molecules according to embodiments of the present disclosure; and
(iv) optionally 0-94% by weight, for example, 0-65% by weight, or 0-50% by weight, of a solvent; and
(v) optionally 0-30% by weight, for example, 0-20% by weight, or 0-5% by weight, of at least one further emitter molecule F with a structure differing from the structure of the molecules according to embodiments of the present disclosure. For example, energy can be transferred from the host compound H to the one or more organic molecules according to embodiments of the present disclosure, for example, transferred from the first excited triplet state T1(H) of the host compound H to the first excited triplet state T1(E) of the one or more organic molecules according to embodiments of the present disclosure E and/or from the first excited singlet state S1(H) of the host compound H to the first excited singlet state S1(E) of the one or more organic molecules according to embodiments of the present disclosure E.

In one embodiment, the host compound H has a highest occupied molecular orbital HOMO(H) having an energy $E^{HOMO}(H)$ in the range of from −5 to −6.5 eV and the at least one further host compound D has a highest occupied molecular orbital HOMO(D) having an energy $E^{HOMO}(D)$, wherein $E^{HOMO}(H)>E^{HOMO}(D)$.

In a further embodiment, the host compound H has a lowest unoccupied molecular orbital LUMO(H) having an energy $E^{LUMO}(H)$ and the at least one further host compound D has a lowest unoccupied molecular orbital LUMO(D) having an energy $E^{LUMO}(D)$, wherein $E^{LUMO}(H)>E^{LUMO}(D)$.

In one embodiment, the host compound H has a highest occupied molecular orbital HOMO(H) having an energy $E^{HOMO}(H)$ and a lowest unoccupied molecular orbital LUMO(H) having an energy $E^{LUMO}(H)$, and the at least one further host compound D has a highest occupied molecular orbital HOMO(D) having an energy $E^{HOMO}(D)$ and a lowest unoccupied molecular orbital LUMO(D) having an energy $E^{LUMO}(D)$, the organic molecule according to embodiments of the present disclosure E has a highest occupied molecular orbital HOMO(E) having an energy $E^{HOMO}(E)$ and a lowest unoccupied molecular orbital LUMO(E) having an energy $E^{LUMO}(E)$, wherein $E^{HOMO}(H)>E^{HOMO}(D)$ and the difference between the energy level of the highest occupied molecular orbital HOMO(E) of the organic molecule according to embodiments of the disclosure E ($E^{HOMO}(E)$) and the energy level of the highest occupied molecular orbital HOMO(H) of the host compound H ($E^{HOMO}(H)$) is between −0.5 eV and 0.5 eV, for example, between −0.3 eV and 0.3 eV, between −0.2 eV and 0.2 eV, or between −0.1 eV and 0.1 eV; and $E^{LUMO}(H)>E^{LUMO}(D)$ and the difference between the energy level of the lowest unoccupied molecular orbital LUMO(E) of the organic molecule according to embodiments of the present disclosure E ($E^{LUMO}(E)$) and the lowest unoccupied molecular orbital LUMO (D) of the at least one further host compound D ($E^{LUMO}(D)$) is between −0.5 eV and 0.5 eV, for example, between −0.3 eV and 0.3 eV, between −0.2 eV and 0.2 eV, or between −0.1 eV and 0.1 eV.

In one embodiment of the present disclosure the host compound D and/or the host compound H is a thermally-activated delayed fluorescence (TADF)-material. TADF materials exhibit a $\Delta E_{ST}$ value, which corresponds to the energy difference between the first excited singlet state (S1) and the first excited triplet state (T1), of less than 2500 $cm^{-1}$. For example, the TADF material exhibits a $\Delta E_{ST}$ value of less than 3000 $cm^{-1}$, for example, less than 1500 $cm^{-1}$, less than 1000 $cm^{-1}$, or less than 500 $cm^{-1}$.

In one embodiment, the host compound D is a TADF material and the host compound H exhibits a $\Delta E_{ST}$ value of more than 2500 $cm^{-1}$. In some embodiments, the host compound D is a TADF material and the host compound H is selected from group consisting of CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole.

In one embodiment, the host compound H is a TADF material and the host compound D exhibits a $\Delta E_{ST}$ value of more than 2500 $cm^{-1}$. In some embodiments, the host compound H is a TADF material and the host compound D is selected from group consisting of T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine).

In a further aspect, embodiments of the present disclosure relate to an optoelectronic device including an organic molecule or a composition of the type described here, for example, in the form of a device selected from the group consisting of an organic light-emitting diode (OLED), a light-emitting electrochemical cell, an OLED sensor, for example, a gas and vapour sensors not hermetically externally shielded, an organic diode, an organic solar cell, an organic transistor, an organic field-effect transistor, an organic laser and a down-conversion element.

In an example embodiment, the optoelectronic device is a device selected from the group consisting of an organic light emitting diode (OLED), a light emitting electrochemical cell (LEC), and a light-emitting transistor.

In one embodiment of the optoelectronic device of embodiments of the present disclosure, the organic molecule according to embodiments of the present disclosure E is used as emission material in a light-emitting layer EML.

In one embodiment of the optoelectronic device of embodiments of the present disclosure, the light-emitting layer EML consists of the composition according to embodiments of the present disclosure described here.

When the optoelectronic device is an OLED, it may, for example, have the following layer structure:

1. substrate
2. anode layer A
3. hole injection layer, HIL
4. hole transport layer, HTL
5. electron blocking layer, EBL
6. emitting layer, EML
7. hole blocking layer, HBL
8. electron transport layer, ETL
9. electron injection layer, EIL
10. cathode layer, wherein the OLED includes each layer selected from the group of HIL, HTL, EBL, HBL, ETL, and EIL only optionally, different layers may be merged and the OLED may include more than one layer of each layer type defined above.

Furthermore, the optoelectronic device may, in one embodiment, include one or more protective layers protecting the device from damaging exposure to harmful species in the environment including, for example, moisture, vapor and/or gases.

In one embodiment of the present disclosure, the optoelectronic device is an OLED, with the following inverted layer structure:

1. substrate
2. cathode layer
3. electron injection layer, EIL
4. electron transport layer, ETL
5. hole blocking layer, HBL
6. emitting layer, B
7. electron blocking layer, EBL
8. hole transport layer, HTL
9. hole injection layer, HIL
10. anode layer A, wherein the OLED includes each layer selected from the group of HIL, HTL, EBL, HBL, ETL, and EIL only optionally, different layers may be merged and the OLED may include more than one layer of each layer types defined above.

In one embodiment of the present disclosure, the optoelectronic device is an OLED, which may have a stacked architecture. In this architecture, contrary to arrangements in which the OLEDs are placed side by side, the individual units are stacked on top of each other. Blended light may be generated by OLEDs exhibiting a stacked architecture, for example, white light may be generated by stacking blue, green and red OLEDs. Furthermore, the OLED exhibiting a stacked architecture may include a charge generation layer (CGL), which may be located between two OLED subunits and may consist of a n-doped and p-doped layer with the n-doped layer of one CGL being located closer to the anode layer.

In one embodiment of the present disclosure, the optoelectronic device is an OLED, which includes two or more emission layers between anode and cathode. For example, this so-called tandem OLED includes three emission layers, wherein one emission layer emits red light, one emission layer emits green light and one emission layer emits blue light, and optionally may include further layers such as charge generation layers, blocking or transporting layers between the individual emission layers. In a further embodiment, the emission layers are adjacently stacked. In a further embodiment, the tandem OLED includes a charge generation layer between each two emission layers. In addition, adjacent emission layers or emission layers separated by a charge generation layer may be merged.

The substrate may be formed by any suitable material or composition of materials. For example, glass slides may be used as substrates. In some embodiments, thin metal layers (e.g., copper, gold, silver or aluminum films) or plastic films or slides may be used. This may allow for a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C is transparent. For example, the anode layer A includes a large content or even consists of transparent conductive oxides (TCOs). Such anode layer A may, for example, include indium tin oxide, aluminum zinc oxide, fluorine doped tin oxide, indium zinc oxide, PbO, SnO, zirconium oxide, molybdenum oxide, vanadium oxide, tungsten oxide, graphite, doped Si, doped Ge, doped GaAs, doped polyaniline, doped polypyrrole and/or doped polythiophene.

The anode layer A (essentially) may consist of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (e.g., holes) in that the transport of the quasi charge carriers from the TCO to the hole transport layer (HTL) is facilitated. The hole injection layer (HIL) may include poly-3,4-ethylenedioxy thiophene (PEDOT), polystyrene sulfonate (PSS), $MoO_2$, $V_2O_5$, CuPC or CuI, for example, a mixture of PEDOT and PSS. The hole injection layer (HIL) may also prevent or reduce diffusion of metals from the anode layer A into the hole transport layer (HTL). The HIL may, for example, include PEDOT:PSS (poly-3,4-ethylendioxy thiophene: polystyrene sulfonate), PEDOT (poly-3,4-ethylendioxy thiophene), mMTDATA (4,4',4"-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenylamino)phenyl]benzidine), MeO-TPD (N,N,N',N'-tetrakis(4-methoxyphenyl)benzidine), HAT-CN (1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL), a hole transport layer (HTL) may be located. Herein, any suitable hole transport compound may be used. For example, electron-rich heteroaromatic compounds such as triarylamines and/or carbazoles may be used as hole transport compound. The HTL may decrease the energy barrier between the anode layer A and the light-emitting layer EML. The hole transport layer (HTL) may also be an electron blocking layer (EBL). For example, hole transport compounds bear comparably high energy levels of their triplet states T1. For example, the hole transport layer (HTL) may include a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris[2-naphthyl(phenyl)amino]tiphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may include a p-doped layer, which may be composed of an inorganic or organic dopant in an organic hole-transporting matrix.

Transition metal oxides such as vanadium oxide, molybdenum oxide or tungsten oxide may, for example, be used as inorganic dopant. Tetrafluorotetracyanoquinodimethane ($F_4$-TCNQ), copper-pentafluorobenzoate (Cu(I)pFBz) or transition metal complexes may, for example, be used as organic dopant.

The EBL may, for example, include mCP (1,3-bis(carbazol-9-yl)benzene), TCTA, 2-TNATA, mCBP (3,3-di(9H-carbazol-9-yl)biphenyl), tris-Pcz, CzSi (9-(4-tert-Butylphenyl)-3,6-bis(triphenylsilyl)-9H-carbazole), and/or DCB (N,N'-dicarbazolyl-1,4-dimethylbenzene).

Adjacent to the hole transport layer (HTL), the light-emitting layer EML may be located. The light-emitting layer EML includes at least one light emitting molecule. For example, the EML includes at least one light emitting molecule according to embodiments of the present disclosure E. In one embodiment, the light-emitting layer includes only the organic molecules according to embodiments of the present disclosure. In some embodiments, the EML additionally includes one or more host materials H. For example, the host material H is selected from CBP (4,4'-Bis-(N-carbazolyl)-biphenyl), mCP, mCBP Sif87 (dibenzo[b,d]thiophen-2-yltriphenylsilane), CzSi, Sif88 (dibenzo[b,d]thiophen-2-yl)diphenylsilane), DPEPO (bis[2-(diphenylphosphino)phenyl] ether oxide), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(tiphenyl-3-yl)-1,3,5-triazine) and/or TST (2,4,6-tris(9,9'-spirobifluorene-2-yl)-1,3,5-triazine). The host material H may be selected to exhibit first triplet (T1) and first singlet (S1) energy levels, which are energetically higher than the first triplet (T1) and first singlet (S1) energy levels of the organic molecule.

In some embodiments of the present disclosure, the EML includes a so-called mixed-host system including at least one hole-dominant host and one electron-dominant host. In some embodiments, the EML includes exactly one light emitting organic molecule according to embodiments of the present disclosure and a mixed-host system including T2T as electron-dominant host and a host selected from CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as hole-dominant host. In a further embodiment the EML includes 50-80% by weight, or, for example, 60-75% by weight of a host selected from CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis (2-dibenzothiophenyl)phenyl]-9H-carbazole; 10-45% by weight, or, for example, 15-30% by weight of T2T and 5-40% by weight, or, for example, 10-30% by weight of light emitting molecule according to embodiments of the present disclosure.

Adjacent to the light-emitting layer EML, an electron transport layer (ETL) may be located. Herein, any suitable electron transporter may be used. As an example, electron-poor compounds such as, e.g., benzimidazoles, pyridines, triazoles, oxadiazoles (e.g., 1,3,4-oxadiazole), phosphinoxides and sulfone, may be used. An electron transporter may also be a star-shaped heterocycle such as 1,3,5-tri(1-phenyl-1H-benzo[d]imidazol-2-yl)phenyl (TPBi). The ETL may include NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-trphenylsilylphenyl-phosphinoxide), BPyTP2 (2,7-di(2,2'-bipyrdin-5-yl)triphenyl), Sif87 (dibenzo[b,d]thiophen-2-yltriphenylsilane), Sif88 (dibenzo [b,d]thiophen-2-yl)diphenylsilane), BmPyPhB (1,3-bis[3,5-di(pyridin-3-yl)phenyl]benzene) and/or BTB (4,4'-bis-[2-(4, 6-diphenyl-1,3,5-trazinyl)]-1,1'-biphenyl). Optionally, the ETL may be doped with materials such as Liq. The electron transport layer (ETL) may also block holes or a holeblocking layer (HBL) is introduced.

The HBL may, for example, include BCP (2,9-dimethyl-4,7-diphenyl-1,10-phenanthroline=Bathocuproine), BAIq (bis(8-hydroxy-2-methylquinoline)-(4-phenylphenoxy)aluminum), NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphinoxide), T2T (2,4,6-tris(biphenyl-3-yl)-1,3,5-triazine), T3T (2,4,6-tris(trphenyl-3-yl)-1,3,5-triazine), TST (2,4,6-tris(9,9'-spirobifluorene-2-yl)-1,3,5-triazine), and/or TCB/TCP (1,3,5-tris(N-carbazolyl)benzol/1,3,5-tris(carbazol)-9-yl) benzene).

Adjacent to the electron transport layer (ETL), a cathode layer C may be located. The cathode layer C may, for example, include or consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer may also consist of (essentially) intransparent metals such as Mg, Ca or Al. In some embodiments, the cathode layer C may also include graphite and or carbon nanotubes (CNTs). In some embodiments, the cathode layer C may also consist of nanoscalic silver wires.

An OLED may further, optionally, include a protection layer between the electron transport layer (ETL) and the cathode layer C (which may be designated as electron injection layer (EIL)). This layer may include lithium fluoride, cesium fluoride, silver, Liq (8-hydroxyquinolinolatolithium), $Li_2O$, $BaF_2$, MgO and/or NaF.

Optionally, the electron transport layer (ETL) and/or a hole blocking layer (HBL) may also include one or more host compounds H.

In order to modify the emission spectrum and/or the absorption spectrum of the light-emitting layer EML further, the light-emitting layer EML may further include one or more further emitter molecules F. Such an emitter molecule F may be any suitable emitter molecule generally used in the art. For example, such an emitter molecule F is a molecule with a structure differing from the structure of the molecules according to embodiments of the present disclosure E. The emitter molecule F may optionally be a TADF emitter. In some embodiments, the emitter molecule F may optionally be a fluorescent and/or phosphorescent emitter molecule which is able to shift the emission spectrum and/or the absorption spectrum of the light-emitting layer EML. In some embodiments, the triplet and/or singlet excitons may be transferred from the organic emitter molecule according to embodiments of the present disclosure to the emitter molecule F before relaxing to the ground state S0 by emitting light that may be red-shifted in comparison to the light emitted by an organic molecule. Optionally, the emitter molecule F may also provoke two-photon effects (e.g., the absorption of two photons of half the energy of the absorption maximum).

Optionally, an optoelectronic device (e.g., an OLED) may, for example, be an essentially white optoelectronic device. For example, such white optoelectronic device may include at least one (deep) blue emitter molecule and one or more emitter molecules emitting green and/or red light. Then, there may also optionally be energy transmittance between two or more molecules as described above.

As used herein, if not defined more specifically in the particular context, the designation of the colors of emitted and/or absorbed light is as follows:

violet: wavelength range of >380-420 nm;
deep blue: wavelength range of >420-480 nm;
sky blue: wavelength range of >480-500 nm;
green: wavelength range of >500-560 nm;
yellow: wavelength range of >560-580 nm;
orange: wavelength range of >580-620 nm;
red: wavelength range of >620-800 nm.

With respect to emitter molecules, such colors refer to the emission maximum. Therefore, for example, a deep blue emitter has an emission maximum in the range of from >420 to 480 nm, a sky blue emitter has an emission maximum in the range of from >480 to 500 nm, a green emitter has an emission maximum in a range of from >500 to 560 nm, a red emitter has an emission maximum in a range of from >620 to 800 nm.

A deep blue emitter may, for example, have an emission maximum of below 480 nm, below 470 nm, below 465 nm, or below 460 nm. It may be above 420 nm, for example, above 430 nm, above 440 nm, or above 450 nm.

Accordingly, a further aspect of embodiments of the present disclosure relates to an OLED, which exhibits an external quantum efficiency at 1000 $cd/m^2$ of more than 8%, for example, more than 10%, more than 13%, more than 15%, or more than 20% and/or exhibits an emission maximum between 420 nm and 500 nm, for example, between 430 nm and 490 nm, between 440 nm and 480 nm, or between 450 nm and 470 nm and/or exhibits a LT80 value at 500 $cd/m^2$ of more than 100 h, for example, more than 200 h, more than 400 h, more than 750 h, or more than 1000 h. Accordingly, a further aspect of embodiments of the present disclosure relates to an OLED, whose emission exhibits a CIEy color coordinate of less than 0.45, for example, less than 0.30, less than 0.20, less than 0.15, or less than 0.10.

A further aspect of embodiments of the present disclosure relates to an OLED, which emits light at a set or distinct color point. According to embodiments of the present disclosure, the OLED emits light with a narrow emission band (small full width at half maximum (FWHM)). In one aspect, the OLED according to embodiments of the present disclosure emits light with a FWHM of the main emission peak of less than 0.30 eV, for example, less than 0.25 eV, less than 0.20 eV, less than 0.19 eV, or less than 0.17 eV.

A further aspect of embodiments of the present disclosure relates to an OLED, which emits light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g. UHD-TVs.

Accordingly, a further aspect of embodiments of the present disclosure relates to an OLED, whose emission exhibits a CIEx color coordinate of between 0.02 and 0.30, for example, between 0.03 and 0.25, between 0.05 and 0.20, between 0.08 and 0.18, or between 0.10 and 0.15 and/or a CIEy color coordinate of between 0.00 and 0.45, for example, between 0.01 and 0.30, between 0.02 and 0.20, between 0.03 and 0.15, or between 0.04 and 0.10.

In a further aspect, embodiments of the present disclosure relate to a method for producing an optoelectronic component. In this case an organic molecule of embodiments of the present disclosure is used.

The optoelectronic device, for example, the OLED can be fabricated by any suitable means of vapor deposition and/or liquid processing. Accordingly, at least one layer is:

prepared by means of a sublimation process, prepared by means of an organic vapor phase deposition process, prepared by means of a carrier gas sublimation process, solution processed or printed.

The methods used to fabricate the optoelectronic device, for example, the OLED should be readily recognizable to those of ordinary skill in the art. The different layers are individually and successively deposited on a suitable substrate by means of subsequent deposition processes. The individual layers may be deposited using the same or differing deposition methods.

Vapor deposition processes, for example, include thermal (co)evaporation, chemical vapor deposition and physical vapor deposition. For active matrix OLED display, an AMOLED backplane is used as substrate. The individual layer may be processed from solutions or dispersions employing adequate solvents. Solution deposition process, for example, include spin coating, dip coating and jet printing. Liquid processing may optionally be carried out in an inert atmosphere (e.g., in a nitrogen atmosphere) and the solvent may be completely or partially removed by any suitable means generally used in the art.

EXAMPLES

General Synthesis Scheme

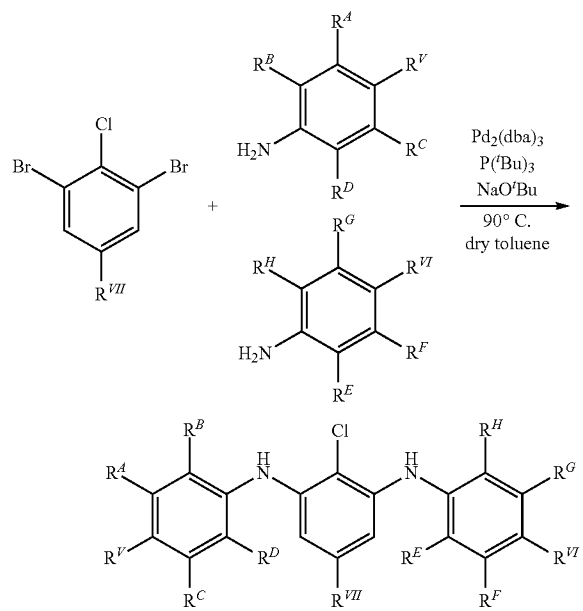

-continued

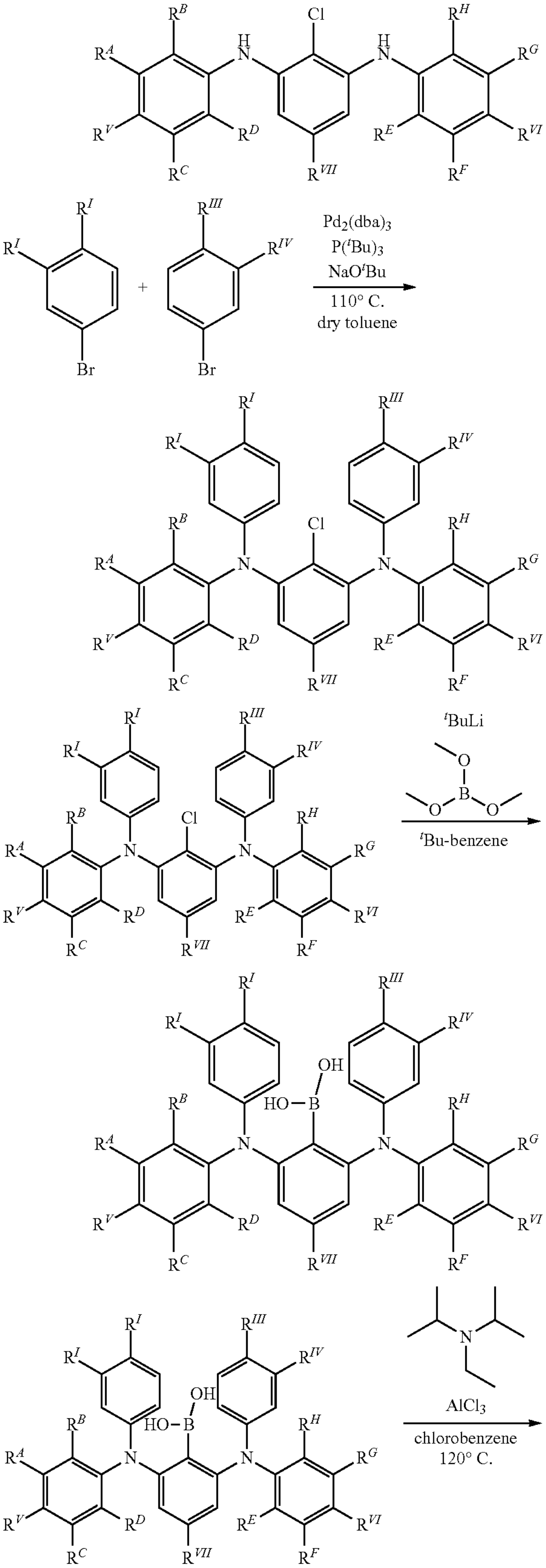

-continued
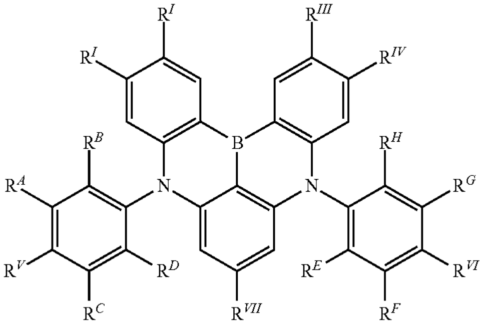
General Synthesis Scheme I
General synthesis scheme I provides a synthesis scheme for organic molecules according to embodiments of the present disclosure, wherein $R^I=R^{III}$ and $R^{II}=R^{IV}$ and wherein n=0 or 1:
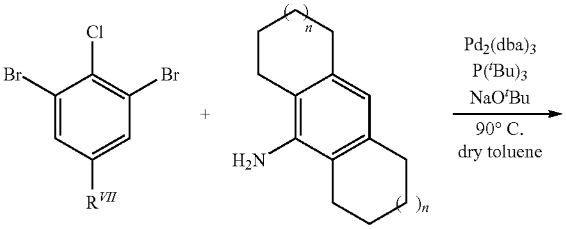
E1 E2
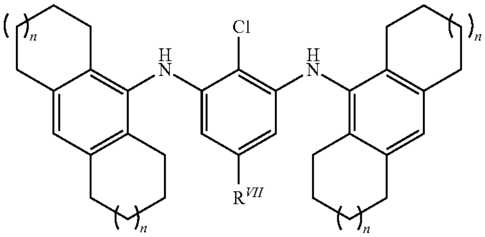
I1
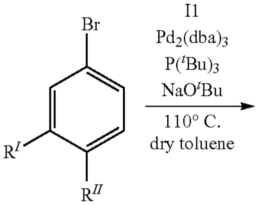
E3
-continued
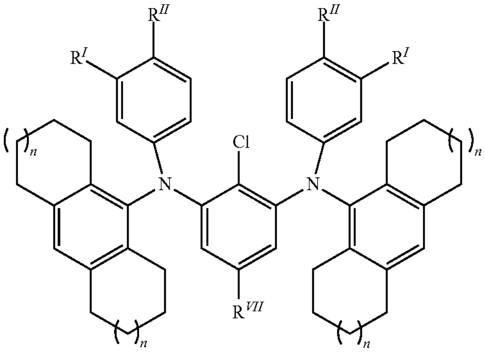
I2
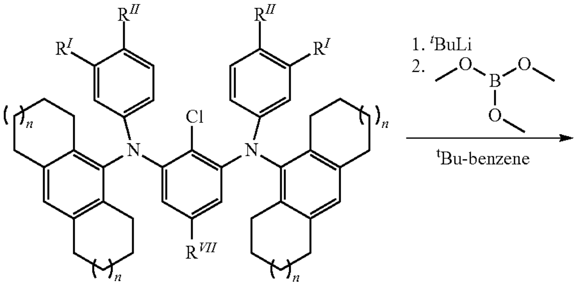
I2
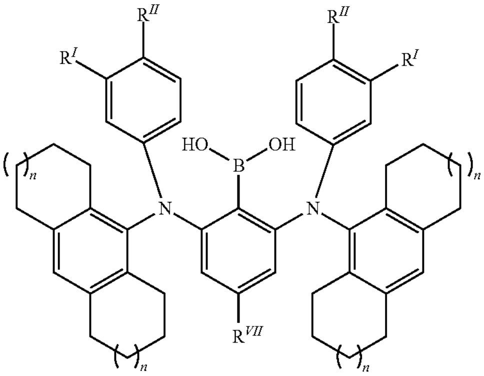
I3
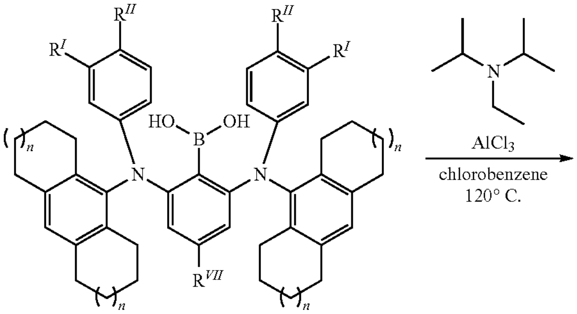
I3

-continued

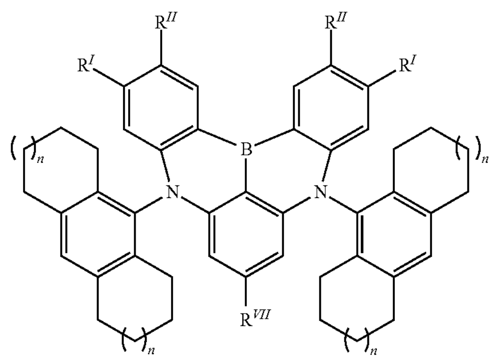

P1

Synthesis Scheme II (Alternative Synthesis of Compound 12)

General synthesis scheme I provides a synthesis scheme for organic molecules according to embodiments of the present disclosure, wherein $R^I$=$R^{III}$, $R^{II}$=$R^{IV}$ and wherein n=0 or 1

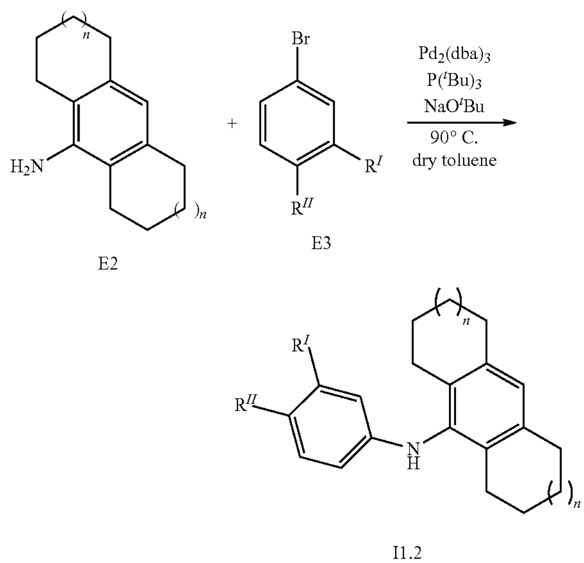

E2 E3

I1.2

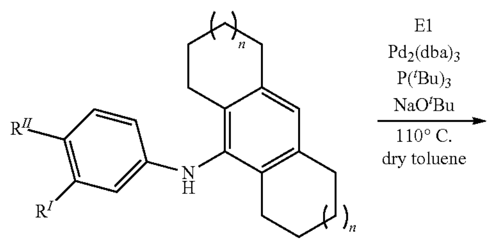

I1.2

-continued

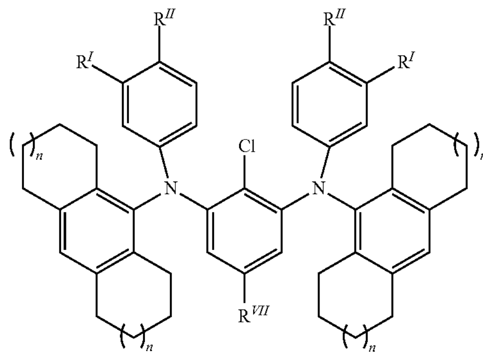

I2

General Procedure for Synthesis AAV1

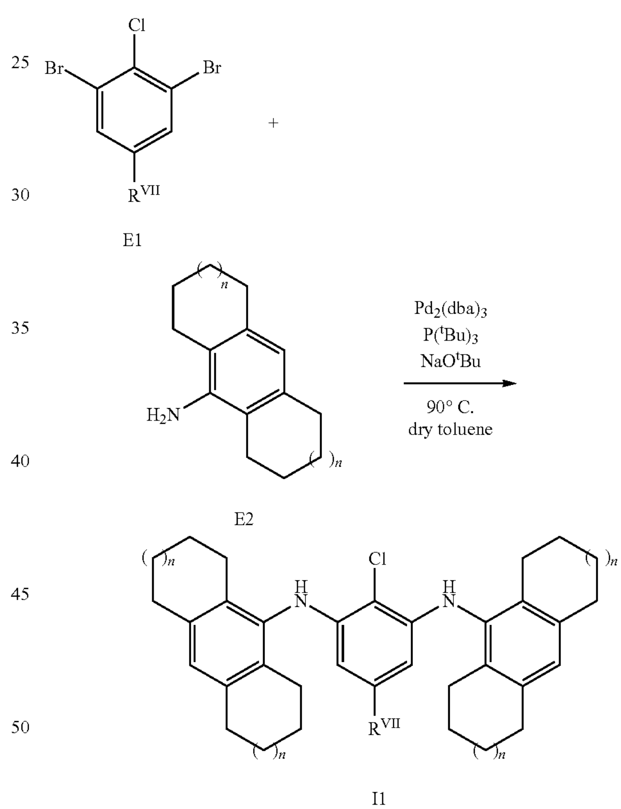

E1

E2

I1

E1 (1.00 equivalent), E2 (2.20 equivalents), tris(dibenzylideneacetone)dipalladium $Pd_2(dba)_3$ (0.01 equivalents, CAS: 51364-51-3), tri-tert-butyl-phosphine $P(^tBu)_3$ (0.04 equivalents, CAS: 13716-12-6) and sodium tert-butoxide $NaO^tBu$ (3.50 equivalents, CAS: 865-48-5) are stirred under nitrogen atmosphere in toluene at 90° C. After cooling down to room temperature (rt) the reaction mixture is extracted with toluene and brine and the phases are separated. The combined organic layers are dried over $MgSO_4$ and then the solvent is removed under reduced pressure. The crude product obtained is purified by recrystallization or column chromatography and I1 is obtained as solid.

General Procedure for Synthesis AAV2

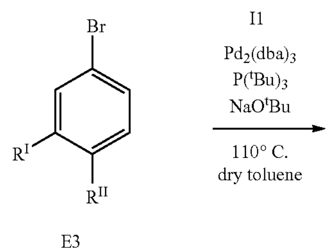

E3

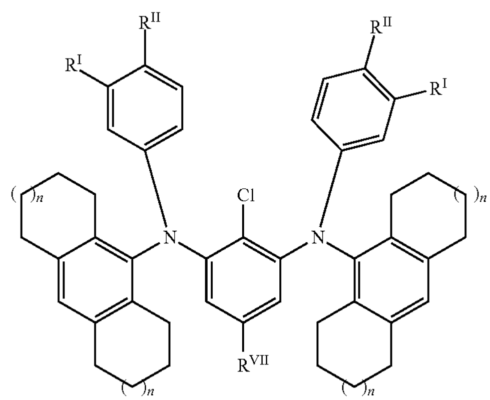

I2

I1 (1.00 equivalents), E3 (2.20 equivalents), tris(dibenzylideneacetone)dipalladium $Pd_2(dba)_3$ (0.01 equivalents; CAS: 51364-51-3), tri-tert-butyl-phosphine $P(^tBu)_3$ (0.04 equivalents, CAS: 13716-12-6) and sodium tert-butoxide $NaO^tBu$ (3.00 equivalents, CAS: 865-48-5) are stirred under nitrogen atmosphere in toluene at 110° C. After cooling down to room temperature (rt) the reaction mixture is extracted with toluene and brine and the phases are separated. The combined organic layers are dried over $MgSO_4$ and then the solvent is removed under reduced pressure. The crude product obtained is purified by recrystallization or column chromatography and I2 is obtained as solid.

General Procedure for Synthesis AAV3

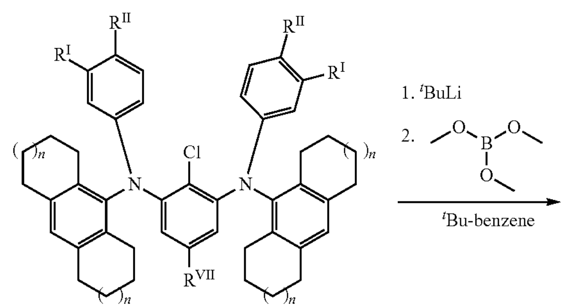

I2

-continued

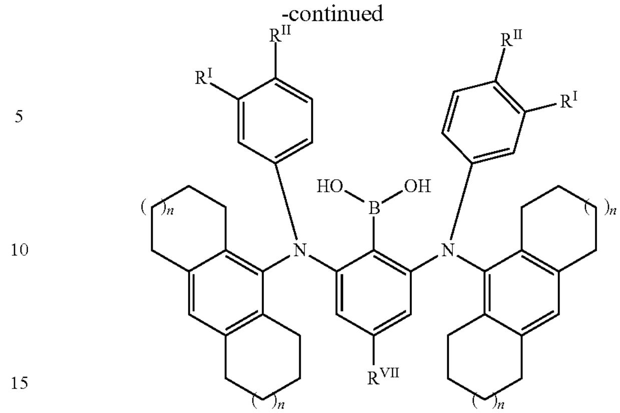

I3

I2 (1 equivalent) is stirred under nitrogen atmosphere in $^t$Bu-benzene at 0° C. Tert-butyllithium ($^t$BuLi, 2.2 equivalents, CAS 594-19-4) is added dropwise and the reaction is heated to 50° C. The lithiation is quenched by slowly adding trimethyl borate (6 equivalents, CAS 121-43-7) at room temperature. After heating the reaction mixture to 60° C. for 2 h, the reaction mixture is cooled down to room temperature. Water is added and the mixture is stirred for another 2 h. After extraction with ethyl acetate, the organic phase is dried over $MgSO_4$ and the solvent is removed under reduced pressure. The crude product obtained is purified by recrystallization or column chromatography and 13 is obtained as solid.

General Procedure for Synthesis AAV4

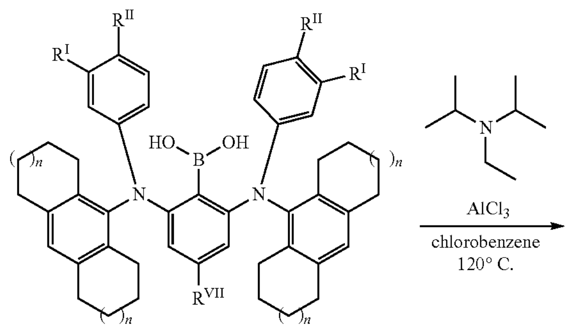

I3

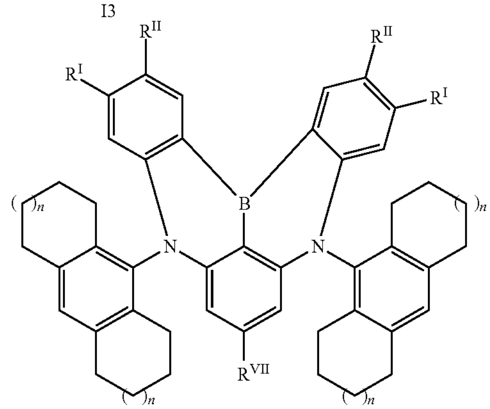

P1

I3 (1 equivalent) is stirred und nitrogen atmosphere in chlorobenzene. N,N-diisopropylethylamine (10.0 equivalents, CAS 7087-68-5) and aluminum chloride ($AlCl_3$, 10.0 equivalents, CAS 7446-70-0) are added and the reaction mixture is heated to 120° C. After 60 min, N,N-Diisopropylethylamine (5.00 equivalents, CAS 7087-68-5) and aluminum chloride ($AlCl_3$, 5.00 equivalents, CAS 7446-70-0) are added and the reaction mixture is stirred for 1.5 h. After cooling down to room temperature, the reaction mixture is extracted between DCM and water. The organic phase is dried over $MgSO_4$ and the solvent is removed under reduced pressure. The residue is purified by recrystallization or column chromatography and P1 is obtained as a solid.

General Procedure for Synthesis AAV5

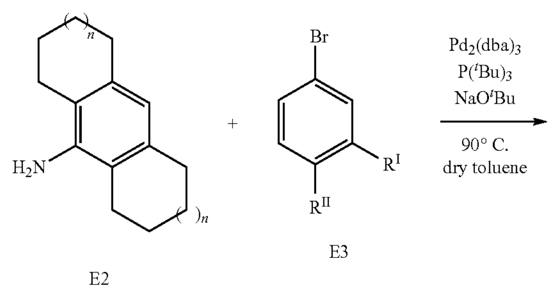

E2

E3

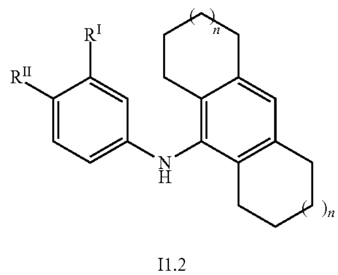

I1.2

E3 (1.00 equivalents), E2 (1.10 equivalents), tris(dibenzylideneacetone)dipalladium $Pd_2(dba)_3$ (0.01 equivalents; CAS: 51364-51-3), tri-tert-butyl-phosphine $P(^tBu)_3$ (0.04 equivalents, CAS: 13716-12-6) and sodium tert-butoxide $NaO^tBu$ (2.00 equivalents, CAS: 865-48-5) are stirred under nitrogen atmosphere in toluene at 90° C. After cooling down to room temperature (rt) the reaction mixture is extracted with toluene and brine and the phases are separated. The combined organic layers are dried over $MgSO_4$ and then the solvent is removed under reduced pressure. The crude product obtained is purified by recrystallization or column chromatography and I1.2 is obtained as a highly viscous oil or a solid.

General Procedure for Synthesis AAV6

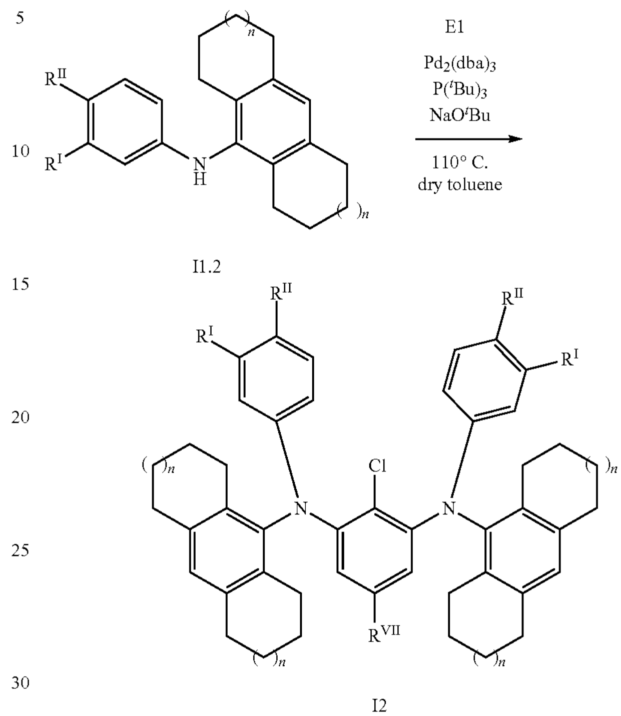

I1.2

I2

E1 (1.00 equivalents), 11.2 (2.20 equivalents), tris(dibenzylideneacetone)dipalladium $Pd_2(dba)_3$ (0.01 equivalents; CAS: 51364-51-3), tri-tert-butyl-phosphine $P(^tBu)_3$ (0.04 equivalents, CAS: 13716-12-6) and sodium tert-butoxide $NaO^tBu$ (3.50 equivalents, CAS: 865-48-5) are stirred under nitrogen atmosphere in toluene at 110° C. After cooling down to room temperature (rt) the reaction mixture is extracted with toluene and brine and the phases are separated. The combined organic layers are dried over $MgSO_4$ and then the solvent is removed under reduced pressure. The crude product obtained is purified by recrystallization or column chromatography and I2 is obtained as a solid.

Cyclic Voltammetry

Cyclic voltammograms are measured from solutions having concentration of $10^{-3}$ mol/L of the organic molecules in dichloromethane or a suitable solvent and a suitable supporting electrolyte (e.g. 0.1 mol/L of tetrabutylammonium hexafluorophosphate). The measurements are conducted at room temperature under nitrogen atmosphere with a three-electrode assembly (Working and counter electrodes: Pt wire, reference electrode: Pt wire) and calibrated using $FeCp_2/FeCp_2^+$ as internal standard. The HOMO data was corrected using ferrocene as internal standard against a saturated calomel electrode (SCE).

Density Functional Theory Calculation

Molecular structures are optimized employing the BP86 functional and the resolution of identity approach (RI). Excitation energies are calculated using the (BP86) optimized structures employing Time-Dependent Density Functional Theory (TD-DFT) methods. Orbital and excited state energies are calculated with the B3LYP functional. Def2-SVP basis sets (and a m4-grid for numerical integration are used. The Turbomole program package is used for all calculations.

Photophysical Measurements

Sample pretreatment: Spin-coating

Apparatus: Spin150, SPS euro.

The sample concentration is 10 mg/ml, dissolved in a suitable solvent.

Program: 1) 3 s at 400 U/min; 20 s at 1000 U/min at 1000 Upm/s. 3) 10 s at 4000 U/min at 1000 Upm/s. After coating, the films are dried at 70° C. for 1 min.

Photoluminescence Spectroscopy and Time-Correlated Single-Photon Counting (TCSPC)

Steady-state emission spectroscopy is measured by a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:

NanoLED 370 (wavelength: 371 nm, pulse duration: 1.1 ns)

NanoLED 290 (wavelength: 294 nm, pulse duration: <1 ns)

SpectraLED 310 (wavelength: 314 nm)

SpectraLED 355 (wavelength: 355 nm).

Data analysis (exponential fit) is done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates are determined using the software U6039-05 version 3.6.0.

Emission maxima are given in nm, quantum yields D in % and CIE coordinates as x,y values.

PLQY can be determined using the following protocol:

Quality assurance: Anthracene in ethanol (known concentration) is used as

REFERENCE

Excitation wavelength: the absorption maximum of the organic molecule can be determined and the molecule can be excited using this wavelength Measurement Quantum yields are measured, for sample, of solutions or films under nitrogen atmosphere. The yield is calculated using the equation:

$$\Phi_{PL} = \frac{n_{photon},\text{ emited}}{n_{photon},\text{ absorbed}} = \frac{\int \frac{\lambda}{hc}\left[\mathrm{Int}^{sample}_{emitted}(\lambda) - \mathrm{Int}^{sample}_{absorbed}(\lambda)\right]d\lambda}{\int \frac{\lambda}{hc}\left[\mathrm{Int}^{reference}_{emitted}(\lambda) - \mathrm{Int}^{reference}_{absorbed}(\lambda)\right]d\lambda}$$

wherein $n_{photon}$ denotes the photon count and Int. the intensity.

Production and Characterization of Optoelectronic Devices

Optoelectronic devices, for example, OLED devices, including organic molecules according to embodiments of the present disclosure can be produced via vacuum-deposition methods. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT 95 to the time point, at which the measured luminance decreased to 95% of the initial luminance etc.

Accelerated lifetime measurements are performed (e.g. applying increased current densities). For example, LT80 values at 500 cd/m$^2$ are determined using the following equation:

$$LT80\left(500\,\frac{\text{cd}}{\text{m}^2}\right) = LT80(L_0)\left(\frac{L_0}{500\frac{\text{cd}}{\text{m}^2}}\right)^{1.6}$$

wherein $L_0$ denotes the initial luminance at the applied current density.

The values correspond to the average of several pixels (e.g., two to eight), the standard deviation between these pixels is given.

HPLC-MS

HPLC-MS analysis is performed on an HPLC by Agilent (1100 series) with MS-detector (Thermo LTQ XL).

An example HPLC method is as follows: a reverse phase column 4.6 mm×150 mm, particle size 3.5 μm from Agilent (ZORBAX Eclipse Plus 95A C18, 4.6×150 mm, 3.5 μm HPLC column) is used in the HPLC. The HPLC-MS measurements are performed at room temperature (rt) following gradients

| Flow rate [ml/min] | Time [min] | A[%] | B[%] | C[%] |
|---|---|---|---|---|
| 2.5 | 0 | 40 | 50 | 10 |
| 2.5 | 5 | 40 | 50 | 10 |
| 2.5 | 25 | 10 | 20 | 70 |
| 2.5 | 35 | 10 | 20 | 70 |
| 2.5 | 35.01 | 40 | 50 | 10 |
| 2.5 | 40.01 | 40 | 50 | 10 |
| 2.5 | 41.01 | 40 | 50 | 10 |

using the following solvent mixtures:

| | | |
|---|---|---|
| Solvent A: | H2O (90%) | MeCN (10%) |
| Solvent B: | H2O (10%) | MeCN (90%) |
| Solvent C: | THF (50%) | MeCN (50%) |

An injection volume of 5 μL from a solution with a concentration of 0.5 mg/mL of the analyte is taken for the measurements.

Ionization of the probe is performed using an atmospheric pressure chemical ionization (APCI) source either in positive (APCI+) or negative (APCI−) ionization mode.

Example 1

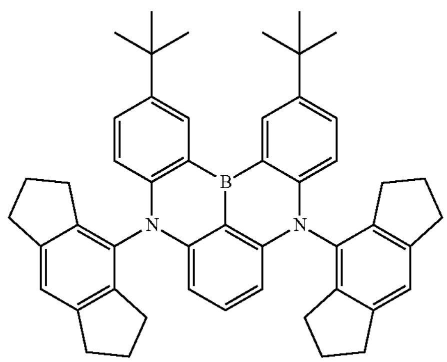 [SMILES: CC(C)(C)c1ccc2c(c1)B1c3cc(C(C)(C)C)ccc3N(c3c4c(cc5c3CCC5)CCC4)c3cccc(c31)N2c1c2c(cc3c1CCC3)CCC2]

Example 1 was synthesized according to

AAV1 (91% yield), wherein 1,3-dibromo-2-chlorobenzene (CAS: 19230-27-4) was used as reactant E1 and 1,2,3,5,6,7-hexahydro-S-5-indacen-4yl-amine (CAS: 63089-56-5) was used as reactant E2;

AAV2 (63% yield), wherein 1-bromo-4-tert-butylbenzene (CAS: 3972-65-4) was used as reactant E3;

AAV3 and AAV4 (18% yield over two steps).

MS (HPLC-MS), m/z (retention time): 693.6 (8.23 min).

The emission maximum of Example 1 (2% by weight in PMMA) is at 458 nm, the full width at half maximum (FWHM) is 0.15 eV, the CIEx and CIEy coordinate is 0.14 and 0.08, respectively.

Additional Examples of Organic Molecules of Embodiments of the Present Disclosure (Note: In the drawn structures, $^t$Bu denotes a bound tertiary butyl group, such that

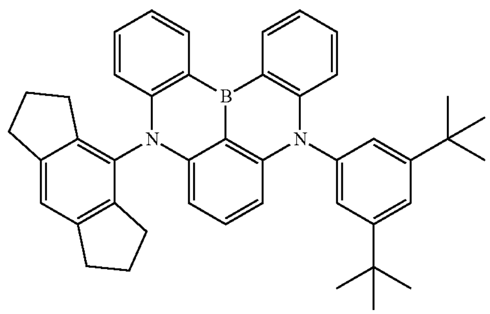

is equal to

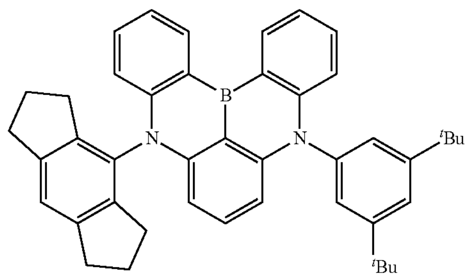

Furthermore, Ph denotes a bound phenyl group, such that

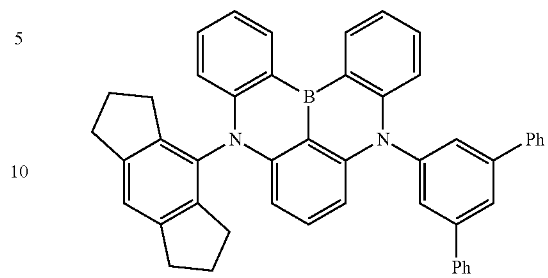

is equal to

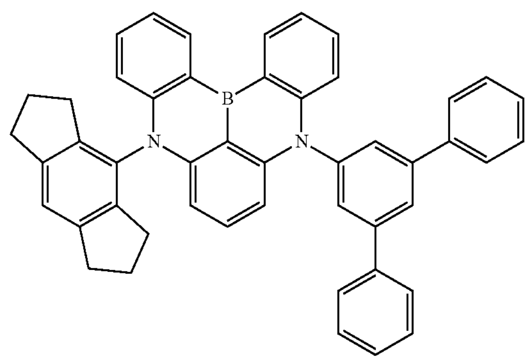

.)

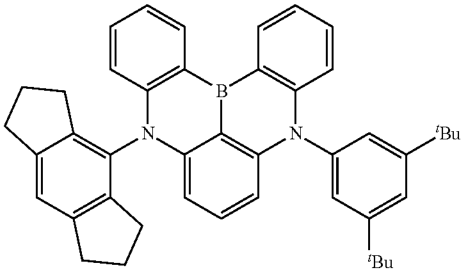 [SMILES: CC(C)(C)c1cc(N2c3ccccc3B3c4ccccc4N(c4c5c(cc6c4CCC6)CCC5)c4cccc2c43)cc(C(C)(C)C)c1]

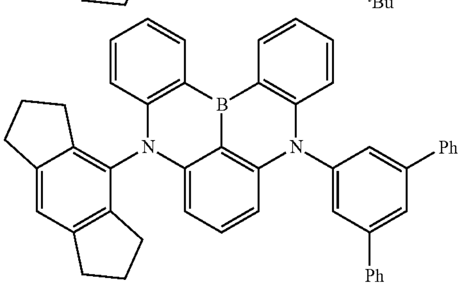

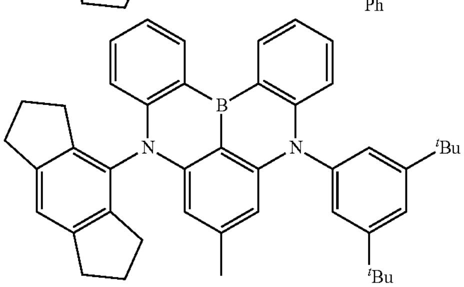

-continued
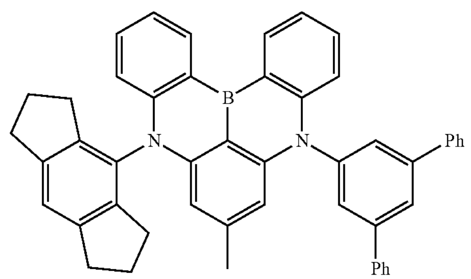 [SMILES: c1ccc(-c2cc(-c3ccccc3)cc(N3c4ccccc4B4c5ccccc5N(c5c6c(cc7c5CCC7)CCC6)c5cccc3c54)c2)cc1]
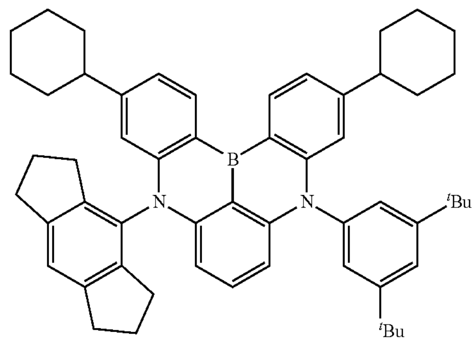
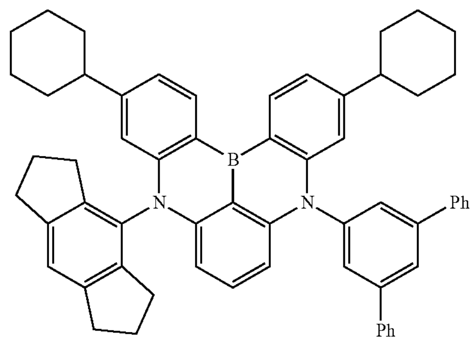
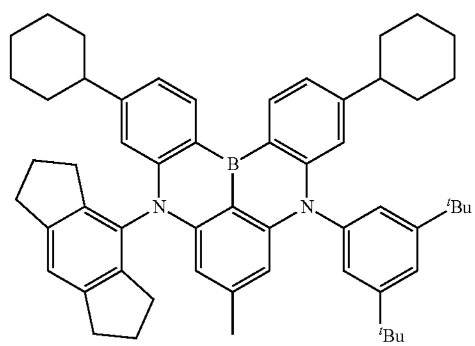
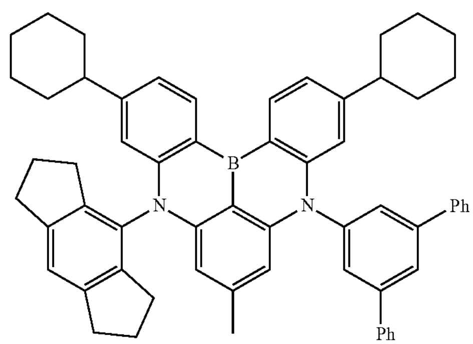
-continued
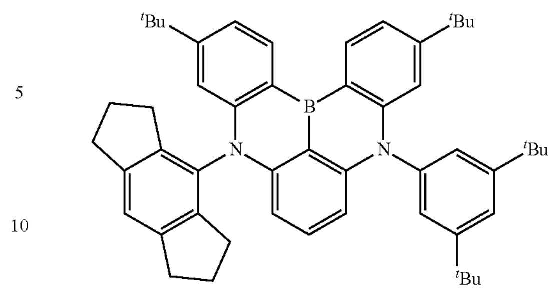
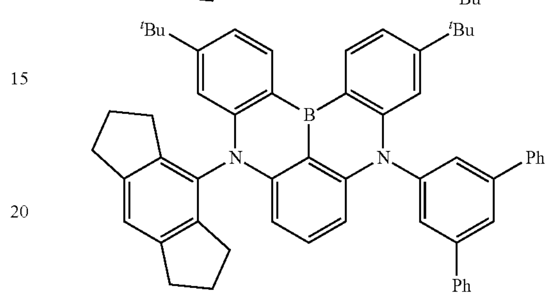
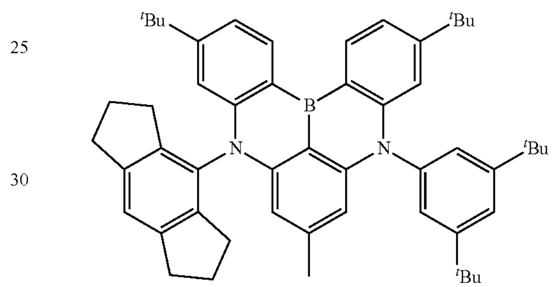
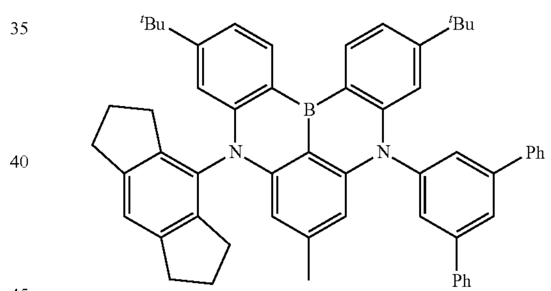
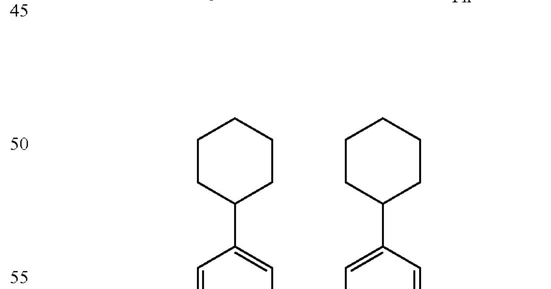
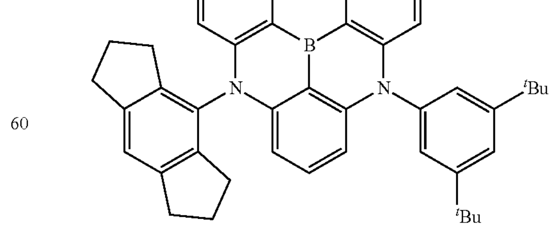

-continued
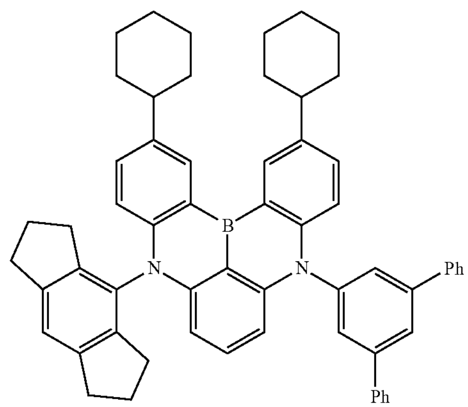
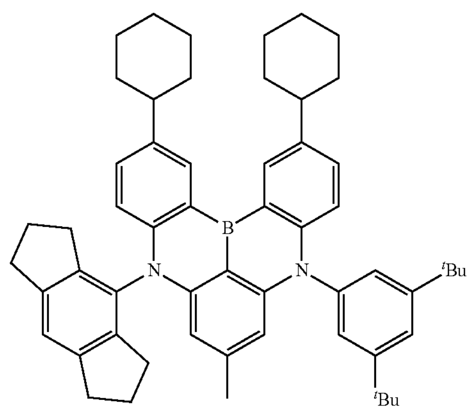
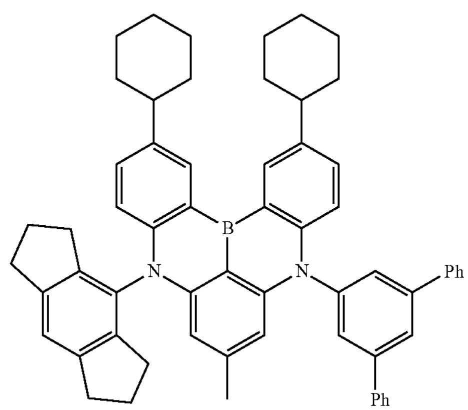
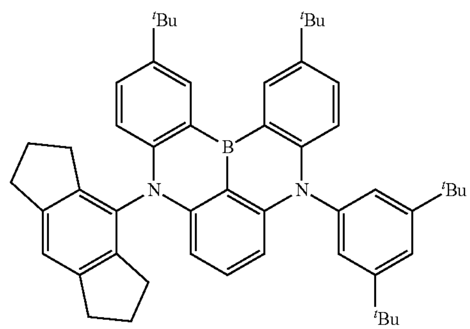
-continued
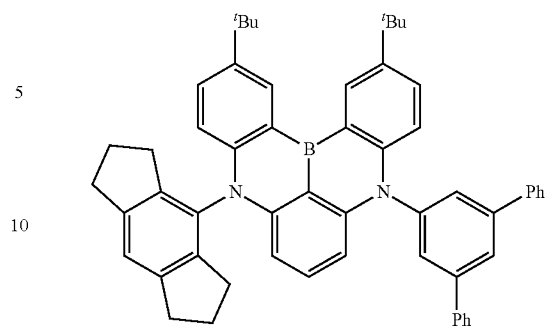
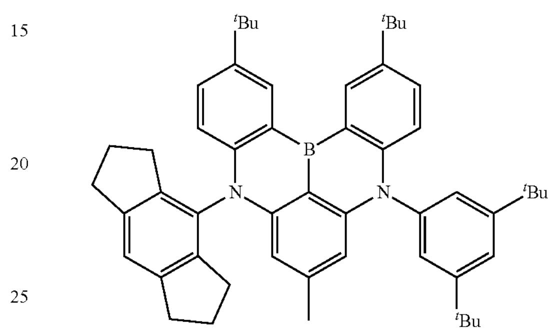
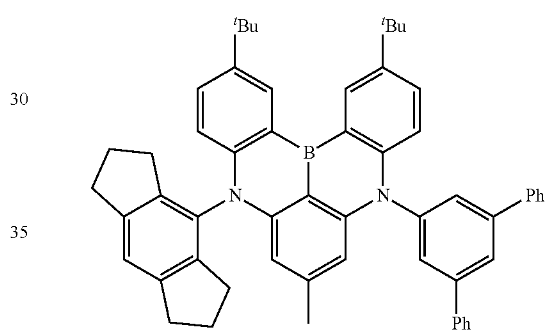
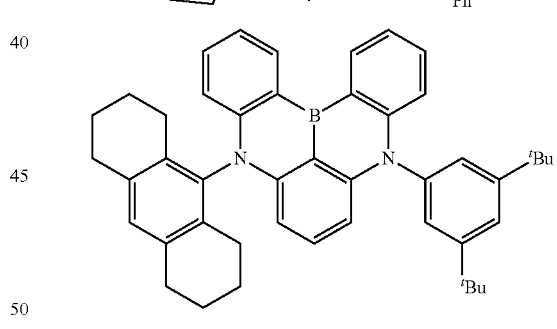
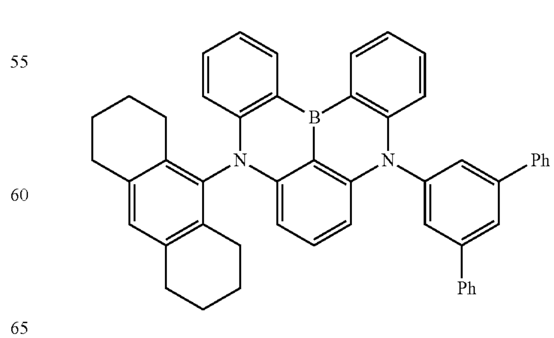

-continued
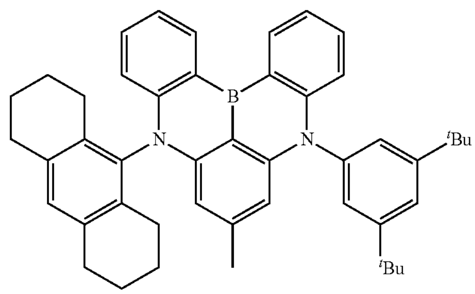
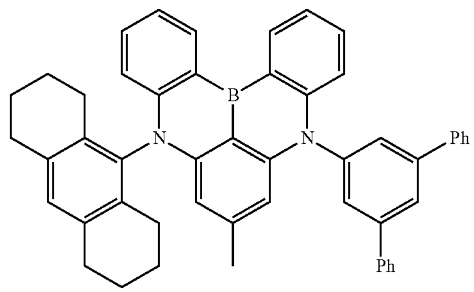
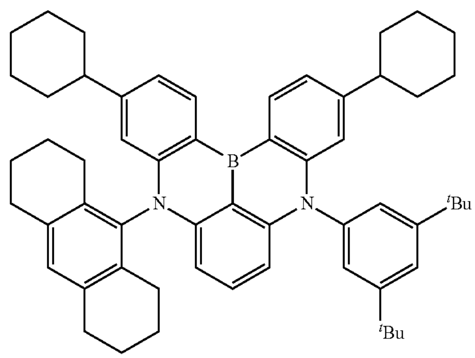
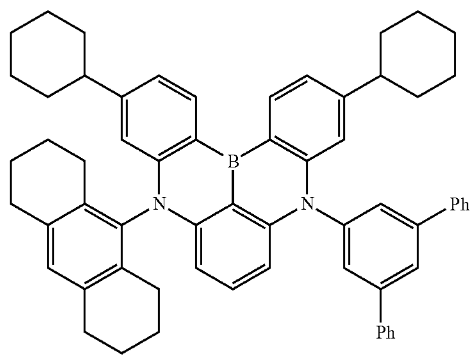
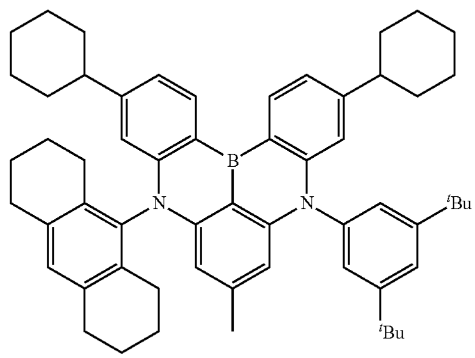
-continued
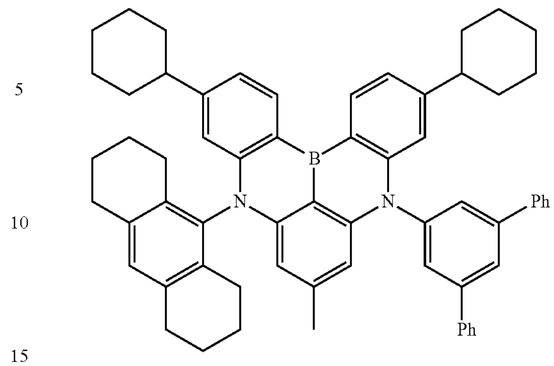
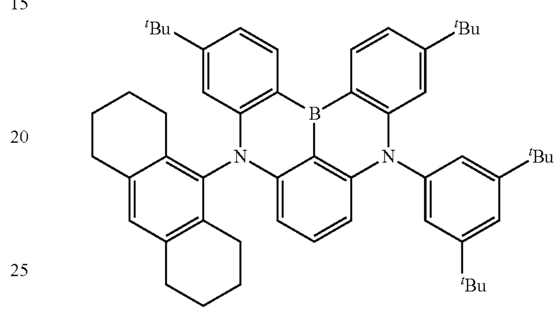
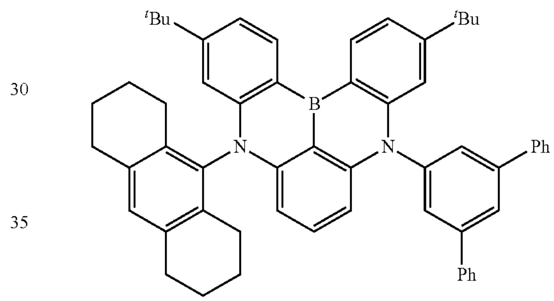
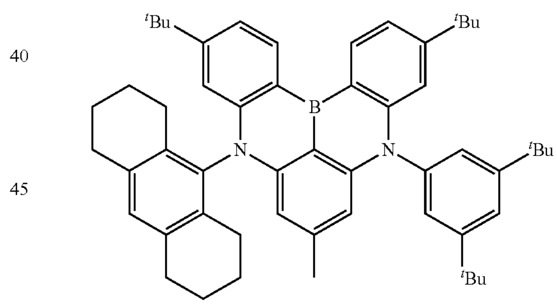
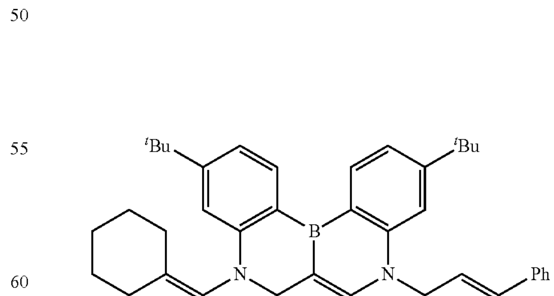
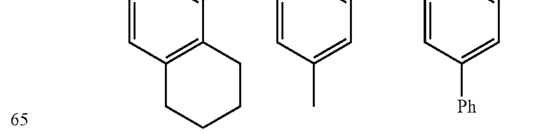

-continued
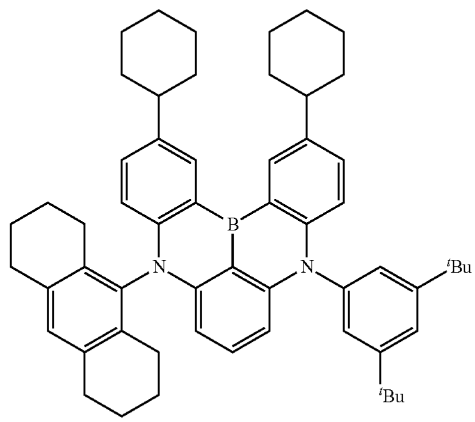
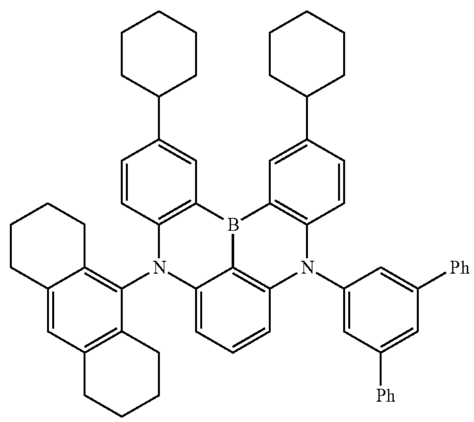
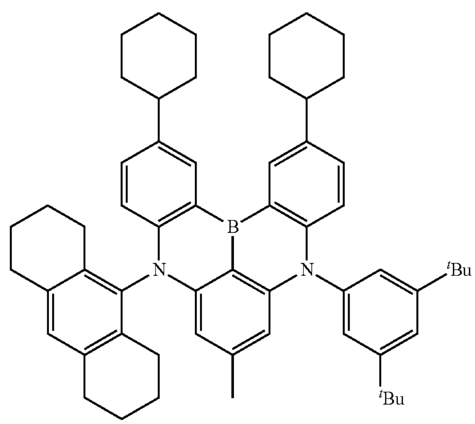
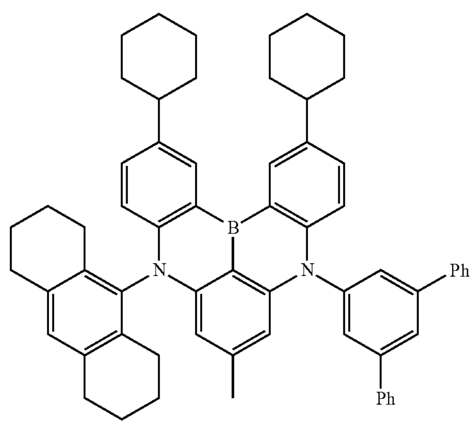
-continued
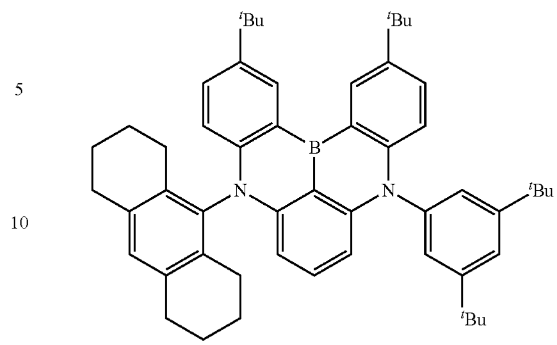
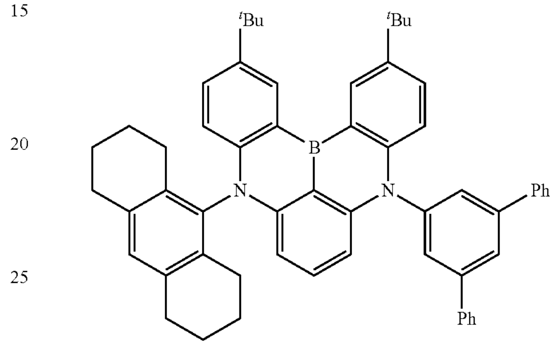
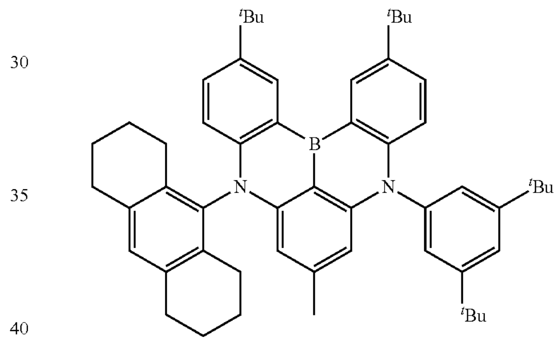
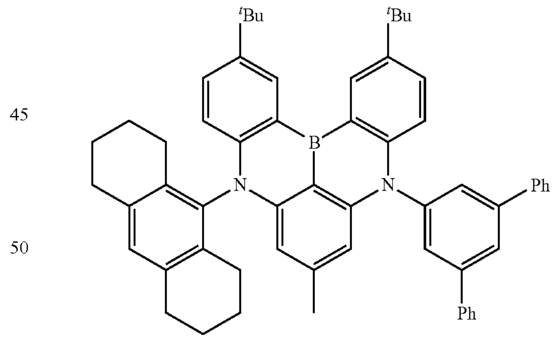
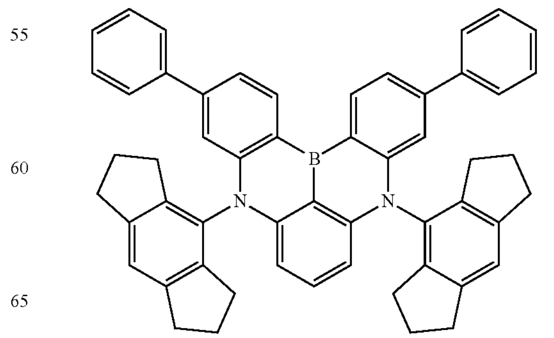

-continued
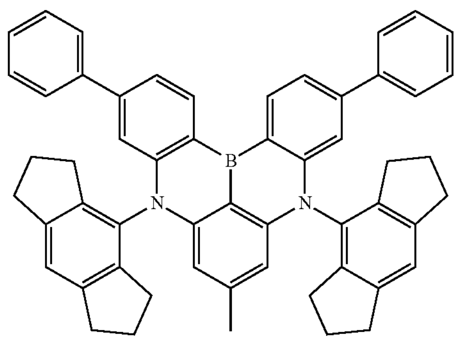
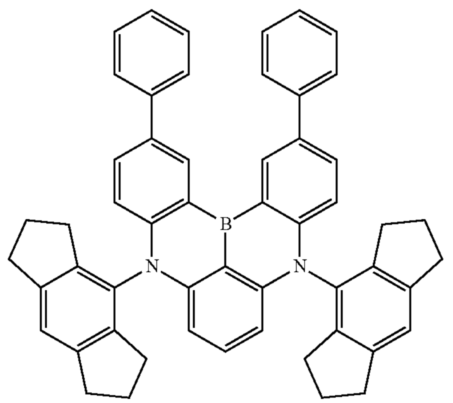
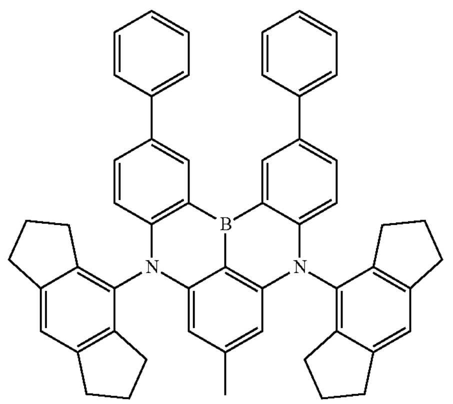
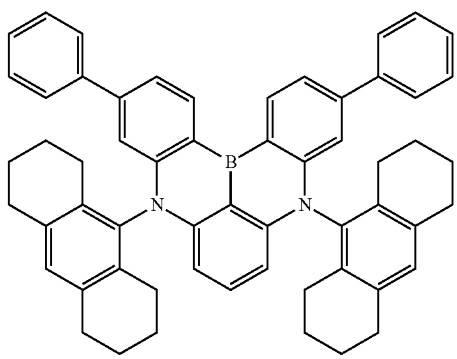
-continued
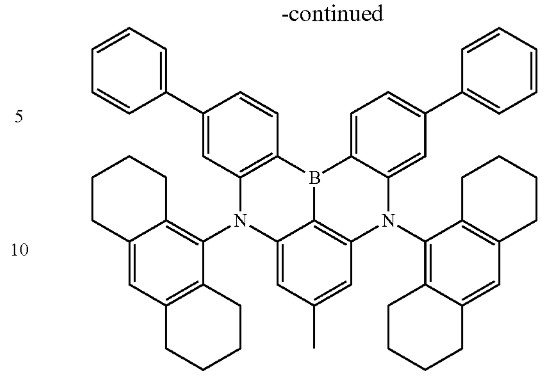
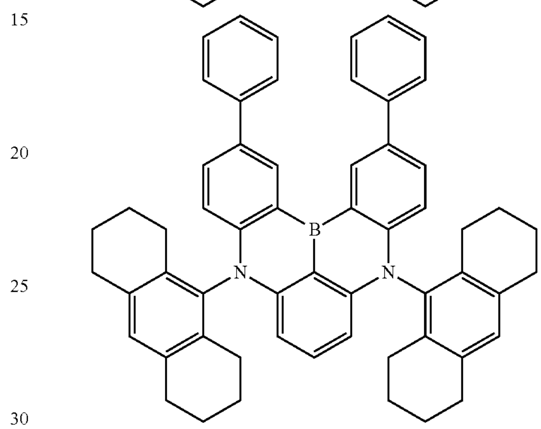
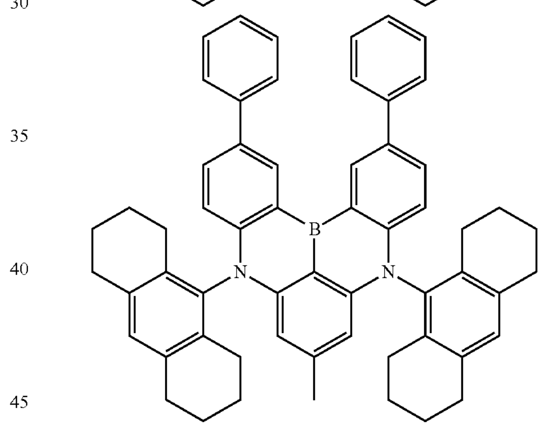
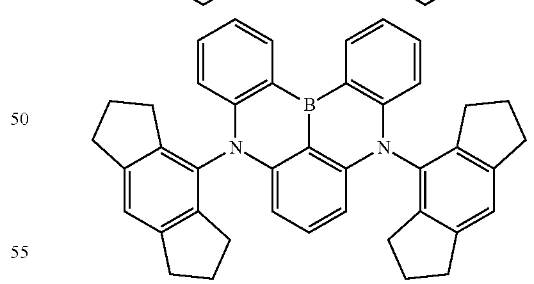
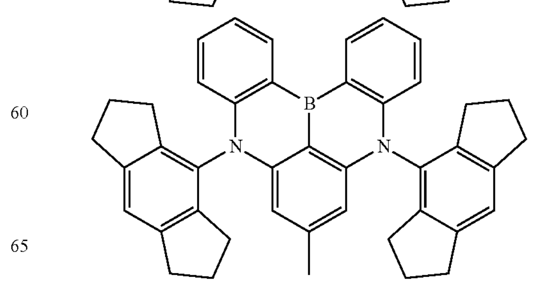

-continued
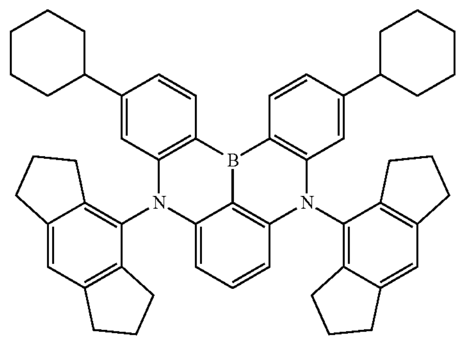
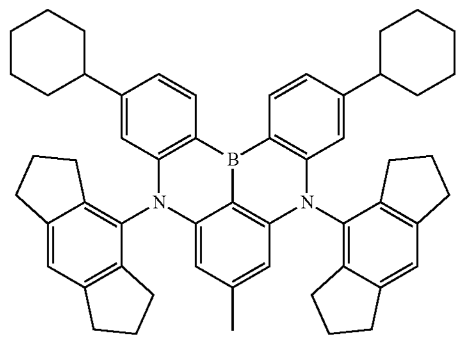
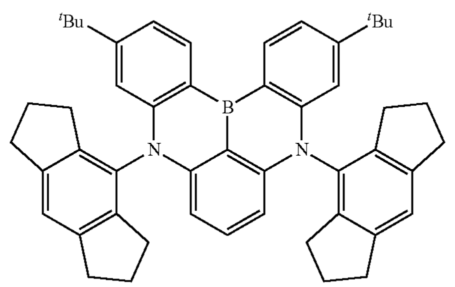
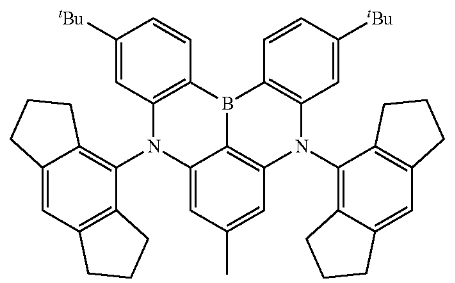
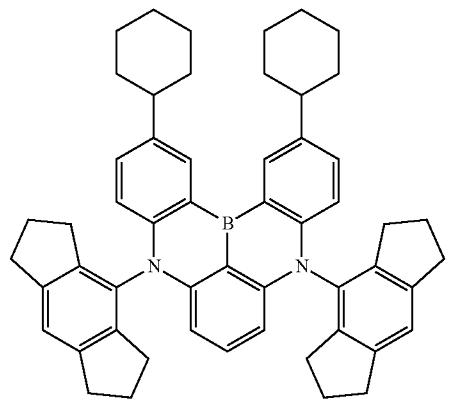
-continued
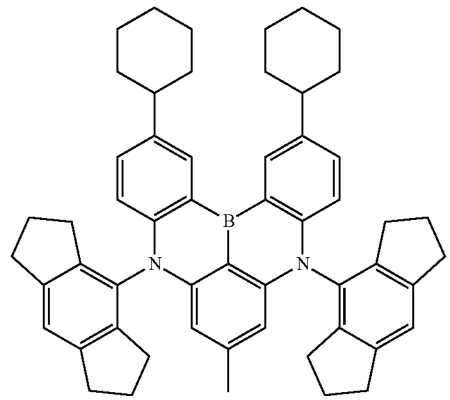
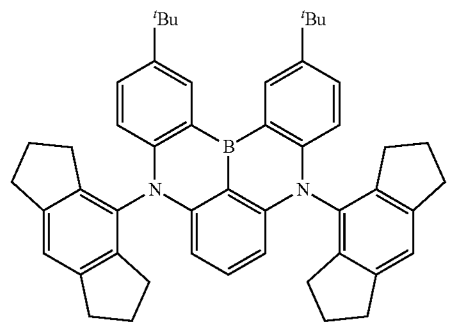
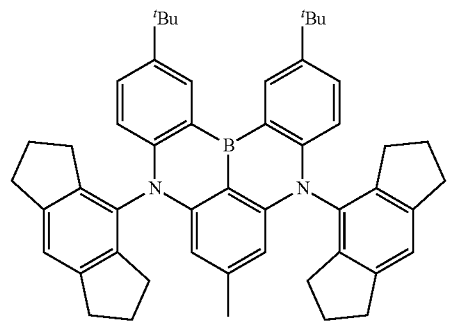
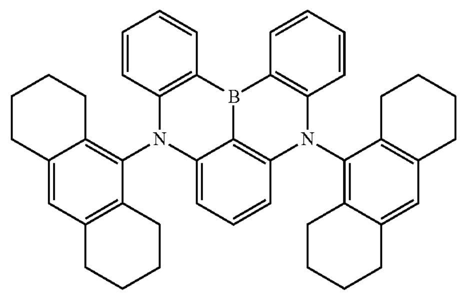
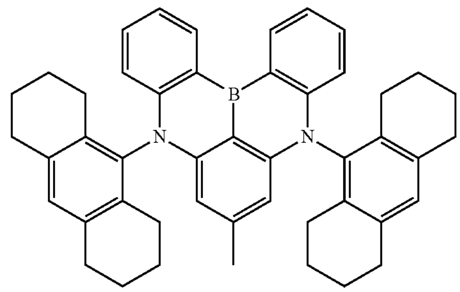

-continued
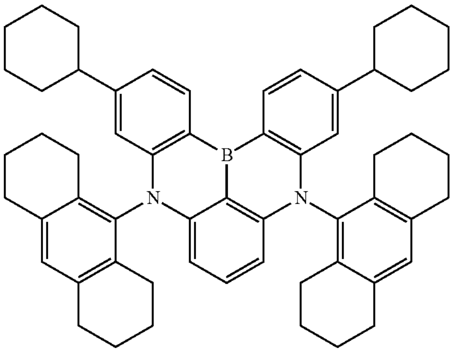
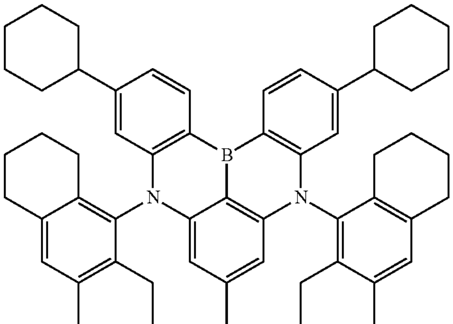
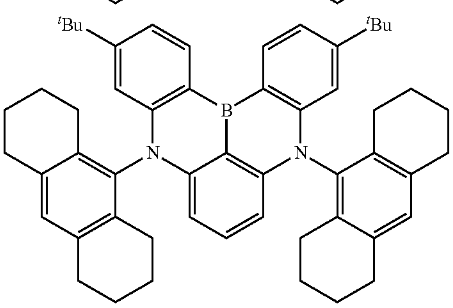
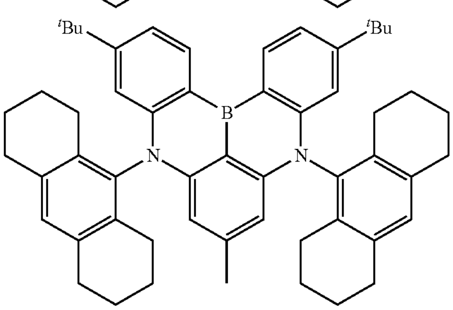
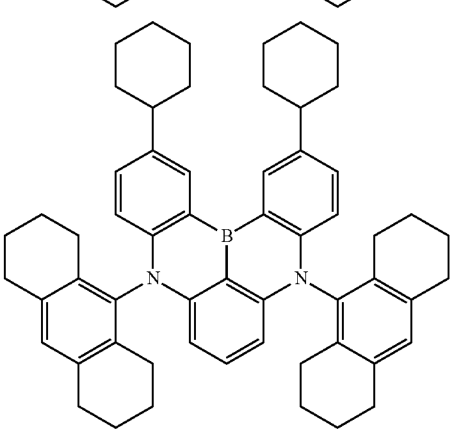
-continued
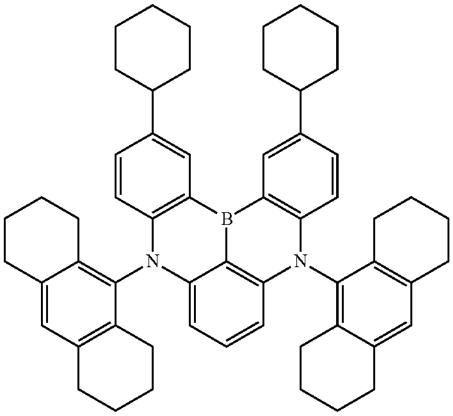
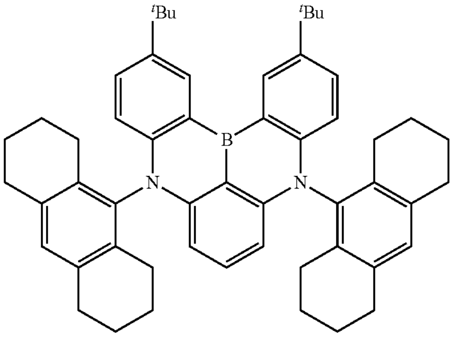
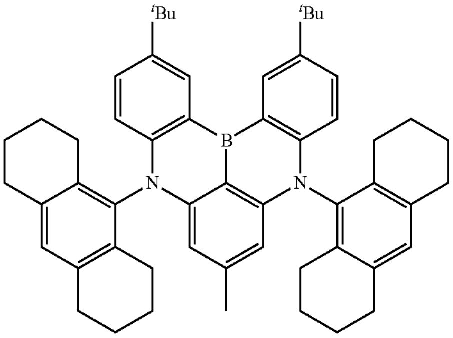
FIGURES
FIGURE Emission spectrum of Example 1 (2% by weight) in PMMA.

The invention claimed is:

1. An organic molecule represented by Formula Ia or Ib:

Formula Ia

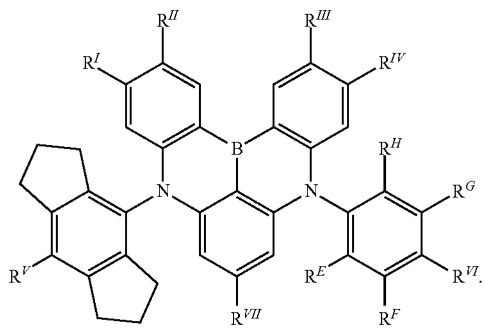

Formula Ib

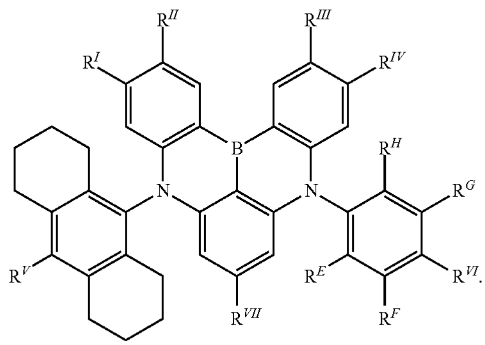

wherein:

$R^{II}$, $R^{III}$, $R^{V}$, $R^{VI}$, and $R^{VII}$ are independently selected from the group consisting of:

hydrogen, deuterium, halogen, unsubstituted $C_1$-$C_4$-alkyl, $C_6$-$C_{18}$-aryl, wherein optionally one or more hydrogen atoms are independently substituted by $R^5$; and $C_3$-$C_{15}$-heteroaryl, wherein optionally one or more hydrogen atoms are independently substituted by $R^5$; and wherein:

$R^I$, $R^{IV}$, $R^E$, $R^F$, $R^G$ and $R^H$ are independently selected from the group consisting of:

hydrogen, deuterium, halogen, $C_1$-$C_{12}$-alkyl, wherein optionally one or more hydrogen atoms are independently substituted by $R^5$;

$C_6$-$C_{18}$-aryl, wherein optionally one or more hydrogen atoms are independently substituted by $R^5$; and $C_3$-$C_{15}$-heteroaryl, wherein optionally one or more hydrogen atoms are independently substituted by $R^5$;

$R^5$ is at each occurrence independently selected from the group consisting of:

hydrogen, deuterium, halogen, $C_1$-$C_{12}$-alkyl, wherein optionally one or more hydrogen atoms are independently substituted by $R^6$;

$C_6$-$C_{18}$-aryl, wherein optionally one or more hydrogen atoms are independently substituted by $R^6$, and $C_3$-$C_{15}$-heteroaryl, wherein optionally one or more hydrogen atoms are independently substituted DY $R^6$;

$R^6$ is at each occurrence independently selected from the group consisting of:

hydrogen, deuterium, halogen, $C_1$-$C_{12}$-alkyl, $C_6$-$C_{18}$-aryl, wherein optionally one or more hydrogen atoms are independently substituted by $C_1$-$C_5$-alkyl substituents, and $C_3$-$C_{15}$-heteroaryl, wherein optionally one or more hydrogen atoms are independently substituted by $C_1$-$C_5$-alkyl substituents:

wherein, optionally, any adjacent two of the group consisting of $R^I$, $R^{II}$, $R^{III}$, $R^{IV}$, $R^V$, $R^{VI}$, $R^{VII}$, $R^E$, $R^F$, $R^G$, and $R^H$ can form a monocyclic ring system having 5 to 8 C-atoms;

wherein, optionally, each hydrogen can independently be substituted by $R^6$;

and, optionally, each hydrogen is independently substituted by deuterium or halogen.

2. The organic molecule according to claim 1, wherein the organic molecule comprises a structure of formula Ia-2:

Formula Ia-2

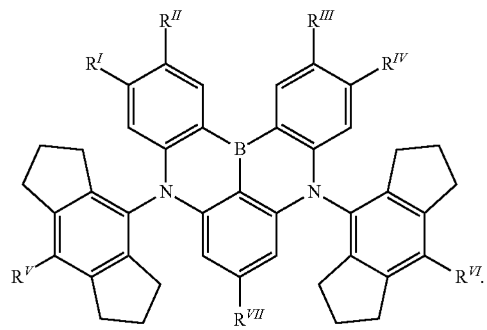

3. The organic molecule according to claim 1, wherein the organic molecule comprises a structure of formula Ib-2:

Formula Ib-2

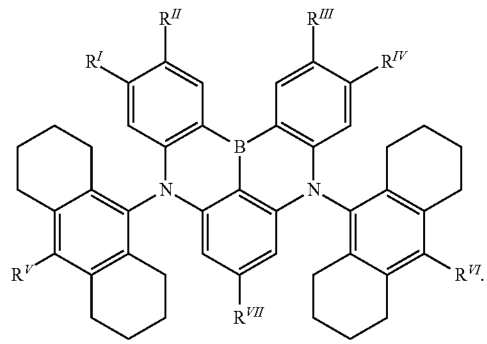

4. The organic molecule according to claim 1, wherein $R^I$, and $R^{IV}$ are independently selected from the group consisting of: hydrogen, deuterium, halogen, $C_1$-$C_{12}$-alkyl, $C_6$-$C_{16}$-aryl, wherein, optionally, one or more hydrogen atoms are independently substituted by $C_1$-$C_5$-alkyl substituents; and $C_3$-$C_{15}$-heteroaryl, wherein, optionally, one or more hydrogen atoms are independently substituted by $C_1$-$C_5$-alkyl substituents;

wherein, optionally, any adjacent two of $R^I$, $R^{II}$, $R^{III}$ and $R^{IV}$ together form a monocyclic ring system having 5 to 8 C-atoms, wherein, optionally, each hydrogen is independently substituted by methyl (Me).

5. The organic molecule according to claim 1, wherein $R^I$ and $R^{IV}$ are independently selected from the group consisting of: hydrogen, deuterium, halogen, methyl (Me), tert-butyl ($^t$Bu), phenyl (Ph), cyclohexyl, and carbazole, wherein, optionally, any adjacent two of $R^I$, $R^{II}$, $R^{III}$ and $R^{IV}$ together form a monocyclic ring system having 5 to 8 C-atoms, wherein, optionally, hydrogen is independently substituted by Me.

6. The organic molecule according to claim 1, wherein $R^I$, and $R^{IV}$ are independently selected from the group consisting of: hydrogen, deuterium, halogen, methyl (Me), tert-butyl ($^t$Bu), phenyl (Ph), cyclohexyl, and carbazole.

7. A composition for an optoelectronic device, the composition comprising:

(a) the organic molecule according to claim 1, (b) an emitter and/or a host material, which differs from the organic molecule, and (c) optionally, a dye and/or a solvent.

8. An optoelectronic device, comprising the organic molecule according to claim 1, wherein the optoelectronic device is selected from the group consisting of an organic light-emitting diode (OLED), a light-emitting electrochemical cell, an OLED sensor, an organic diode, an organic solar cell, an organic transistor, an organic field-effect transistor, an organic laser, and a down-conversion element.

9. The optoelectronic device according to claim 8, comprising:

a substrate, an anode, and a cathode, wherein the anode or the cathode is on the substrate, and a light-emitting layer between the anode and the cathode, the light-emitting layer comprising the organic molecule.

* * * * *